United States Patent [19]
Morishita et al.

[11] Patent Number: 5,789,790
[45] Date of Patent: Aug. 4, 1998

[54] SEMICONDUCTOR DEVICE

[75] Inventors: Masakazu Morishita, Hiratsuka; Shigetoshi Sugawa, Atsugi; Toru Koizumi, Yokohama, all of Japan

[73] Assignee: Canon Kabushiki Kaisha, Tokyo, Japan

[21] Appl. No.: 549,517

[22] Filed: Oct. 27, 1995

Related U.S. Application Data

[62] Division of Ser. No. 345,337, Nov. 21, 1994, Pat. No. 5,508,550, which is a continuation of Ser. No. 119,629, Sep. 13, 1993, abandoned.

[30] Foreign Application Priority Data

Sep. 15, 1992 [JP] Japan ................. 4-270972
Mar. 31, 1993 [JP] Japan ................. 5-73586

[51] Int. Cl.$^6$ ............... H01L 29/76; H01L 31/062; H01L 31/113; H01L 31/119
[52] U.S. Cl. ........................ 257/378; 257/370
[58] Field of Search ................ 257/378, 370, 257/566

[56] References Cited

U.S. PATENT DOCUMENTS

| | | | |
|---|---|---|---|
| 4,314,267 | 2/1982 | Bergeron et al. | 357/43 |
| 4,609,931 | 9/1986 | Koike | 257/357 |
| 4,612,629 | 9/1986 | Harari | 365/185 |
| 4,672,416 | 6/1987 | Nakazato et al. | 257/566 |
| 4,830,973 | 5/1989 | Mastroianni | 257/566 |
| 4,939,563 | 7/1990 | Fang et al. | 257/566 |
| 4,947,192 | 8/1990 | Hawkins et al. | 346/140 |
| 5,034,782 | 7/1991 | Koizumi et al. | 357/13 |
| 5,040,041 | 8/1991 | Yamada et al. | 357/30 |
| 5,075,250 | 12/1991 | Hawkins et al. | 437/52 |
| 5,140,400 | 8/1992 | Morishita | 357/54 |
| 5,177,584 | 1/1993 | Uchida et al. | 257/566 |
| 5,412,240 | 5/1995 | Inoue et al. | 257/347 |
| 5,434,441 | 7/1995 | Inoue et al. | 257/347 |

FOREIGN PATENT DOCUMENTS

| | | |
|---|---|---|
| 0251682 | 1/1988 | European Pat. Off. . |
| 0272753 | 6/1988 | European Pat. Off. . |
| 0474564 | 3/1992 | European Pat. Off. . |
| 2294076 | 12/1990 | Japan . |
| 2178593 | 2/1987 | United Kingdom . |

OTHER PUBLICATIONS

Muller et al, *Device Electronics for IC's*, pp. 354–356, 448, © 1986.

Patent abstracts of Japn, vol. 11, No. 320 (E–550) 17 Oct. 1987 & JP–A–62 110 332 (Citizen Watch).

Patent abstracts of Japan, vol. 6, No. 67 (E–104) 28 Apr. 1982 & JP–A–57 010 267 (Fujitsu).

S. Verdonckt–Vanderbroek et al., "High–Gain Lateral Bipolar Action in a MOSFET Structure," IEEE Transactions of Electron Devices, vol. 38, No. 11, pp. 2487–2496 (Nov. 1991).

*Primary Examiner*—Stephen Meier
*Attorney, Agent, or Firm*—Fitzpatrick, Cella, Harper & Scinto

[57] ABSTRACT

A semiconductor device has a transistor made of a semiconductor which has a source and drain regions, a channel region, a gate insulative film, and a gate electrode. The gate electrode is connected to a part of the channel region. The channel region has the same conductivity type as that of the source and drain regions and has an impurity concentration lower than that of the source and drain regions.

8 Claims, 29 Drawing Sheets

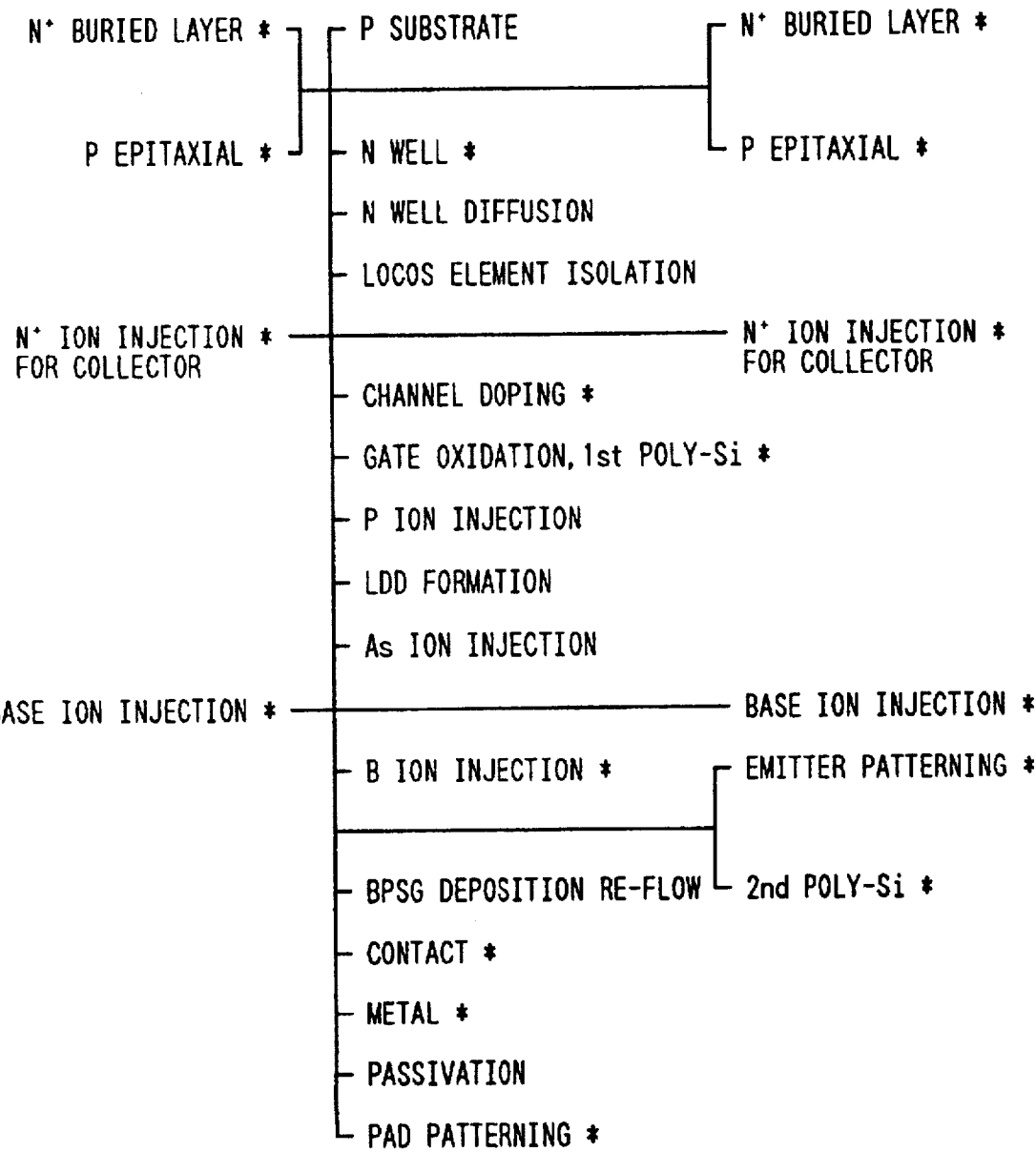

X-X' CROSS SECTION

FIG. 18

- SOI SUBSTRATE, P-Si LAYER
- LOCOS ELEMENT ISOLATION *
  OR Si LAYER PATTERNING
- N WELL *
- GATE OXIDATION
- BASE CONTACT *
- POLY-Si
- B ION INJECTION *
- P ION INJECTION *
- POLY Si PATTERNING *
- As ION INJECTION *
- B ION INJECTION *
- INTER LAYER INSULATIVE FILM
- CONTACT *
- METAL *
- PASSIVATION
- PAD PATTERNING *

* MARK : MASK PATTERNING PROCESS

1
SEMICONDUCTOR DEVICE

This application is a division of application Ser. No. 08/345,337 filed Nov. 21, 1994, now U.S. Pat. No. 5,508, 550 which is a continuation of application Ser. No. 08/119, 629 filed Sep. 13, 1993, now abandoned.

BACKGROUND OF THE INVENTION

1. Field of the Invention

The present invention relates to a semiconductor device and, more particularly, to a semiconductor device which is suitable when it is applied to a semiconductor device including a majority carrier device such as an MOS transistor which is used in various kinds of electronic apparatuses or to a highly integrated semiconductor device of a high speed and a high withstanding voltage.

2. Related Background Art

In a conventional bipolar transistor, there is a limitation in the high frequency characteristics due to an Early effect, a withstanding voltage, or a parasitic capacitance which depends on the design of the base region.

For instance, in case of a lateral type pnp bipolar transistor shown in FIG. 1, an extent of a current and a substantially wide space region are necessary in terms of a structure, so that a current amplification factor is low. Since a depletion layer from a collector region 101 extends to a base region 103, it is necessary to set a thickness of base layer (n-Epi) 104 to a large value because of an Early effect or a junction withstanding voltage. There is a problem such that good high frequency characteristics cannot be obtained. Since the base region 103 is large, there is also a problem such that a parasitic capacitance of the base region 103 is large. In particular, when the base also has a buried region, a capacitance between the base and a p-type substrate 105 is large and the high frequency characteristics deteriorate. In FIG. 1, reference numeral 106 denotes an $n^+$ region; 107 an insulative layer such as $SiO_2$ or the like; 108 a channel stop; and 109 a contact region.

A lateral type bipolar transistor with a gate shown in FIGS. 2A to 2C also has a similar drawback and a problem on process. In the diagram, FIG. 2A is a plan view, FIG. 2B is a cross sectional view taken along the line 2B-2B' in FIG. 2A, and FIG. 2C is a cross sectional view taken along the line 2C-2C' in FIG. 2A. Namely, $n^+$ polysilicon 205 is used as a gate 201, the surface potential between an emitter 203 and a collector 202 is reduced, and a mutual conductance ($C_m$) is raised. In the $n^+$ polysilicon 205, no ohmic contact is obtained for a p-well 204. As shown by α in FIG. 2B, there is a problem such that after completion of the working, an ohmic contact must be obtained by a metal 206 through the p-well 204 and an ohmic contact region 207.

On the other hand, a Bi-CMOS semiconductor device in which a bipolar transistor and a CMOS transistor mixedly exist is promising and has widely been put into practical use as a semiconductor device having advantages of both of those transistors: namely, a high processing speed, a high driving ability, and a high analog precision of the bipolar transistor; and a high packing performance, a low electric power consumption, a high input impedance, and the like of the CMOS transistor.

In the conventional Bi-CMOS process, a bipolar transistor and a CMOS transistor are formed by different processes, respectively. FIG. 3 is a flowchart for a conventional typical Bi-CMOS process. In the conventional examples, the case of forming a bipolar transistor of an ion implantation emitter and the case of forming a bipolar transistor of a polysilicon emitter are shown, respectively.

As will be understood from FIG. 3, a conventional Bi-CMOS has a problem such that its manufacturing process is complicated. Namely, in case of forming a bipolar transistor of an ion implantation emitter, four masks are added to the standard CMOS process. In case of forming a bipolar transistor of a polysilicon emitter, six masks are added to the standard CMOS process. Consequently, 14 masks and 16 masks are necessary through the Bi-CMOS process, respectively. According to the conventional Bi-CMOS process, an occupied area of a bipolar transistor region and an element isolation area are large, such large areas obstruct the realization of a high integration degree.

As a method of solving such a problem, for example, a trial such as to form a bipolar transistor without adding the masks in the CMOS processing step has been performed as shown in "IEEE Transactions On Electron Devices", Vol. 38, No. 11, pages 2487–2496, 1991. FIGS. 4A to 4C show a lateral type npn bipolar transistor which is formed on a bulk silicon wafer by the above method. In the diagram, when $n^+$ polysilicon 401 is patterned, a channel contact region 402 is opened. In order to obtain an ohmic contact with a p well 404, a $p^+$ region 406 is ion implanted into the opening portion 402 by the same step as a step of forming a source and a drain of a PMOS transistor. Further, a metal contact region 403 which is wider than an opening of a channel contact is opened. A channel potential is obtained by a metal (not shown) deposited in such an opening portion, thereby forming a base electrode. FIG. 4A is a schematic plan view. FIG. 4B is a schematic cross sectional view taken along the line 4B-4B' in FIG. 4A.

The lateral type bipolar transistor formed on the bulk silicon by the above method has a problem that it is difficult to not only improve the driving ability but also maintain the withstanding voltage. That is, in order to raise a current amplification factor and a high frequency cut-off frequency, it is necessary to reduce a gate length of polysilicon serving as a base width and to decrease a concentration of the p well serving as a base region. However, since a punch through withstanding voltage between the emitter and the collector decreases due to this, it is necessary to increase the polysilicon gate length or to reduce a power source voltage on the collector side. However, in such a bipolar transistor of a long base width and a low collector voltage, it cannot help deteriorating the driving ability.

Such a lateral type bipolar transistor formed on the bulk silicon has a problem that a high processing speed is obstructed. This is because the base region is a large p well region and a junction capacity between the base and the p well substrate is mainly added as a parasitic capacity to the base.

In the conventional silicon wafer bulk process, on the other hand, a vertical type bipolar transistor and a lateral type transistor are formed as shown in FIGS. 5 and 6, respectively. In FIG. 5, reference numeral 251 denotes a first vertical type npn bipolar transistor; 252 a second vertical type npn bipolar transistor; and 253 an element isolation region to electrically isolate the bipolar transistors 251 and 252. In the diagram, a collector of the bipolar transistor 251 and an emitter of the bipolar transistor 252 are electrically connected by a wiring 265. Reference numeral 254 denotes a p-type silicon substrate; 255 and 255' $n^+$-type regions serving as collector regions of the bipolar transistors; 256 an $n^-$-type epitaxial region; 257 a p-type region to electrically isolate the bipolar transistors 251 and 252; 258 a selective oxide region; 259 and 259' collector lead-out layers; 260 and 260' p-type base regions; 261 and 261' n⁺ type emitter regions; 262 an inter-layer insulative layer; 263, 264, 265, 266, and 267 Al electrodes; and 268 a passivation insulative layer.

In FIG. 6, reference numeral 271 denotes a first lateral type pnp bipolar transistor; 272 a second lateral type pnp bipolar transistor; and 273 an element isolation region to electrically isolate the bipolar transistors 271 and 272. In the diagram, a collector of the bipolar transistor 271 and an emitter of the bipolar transistor 272 are electrically connected by a wiring 285. Reference numeral 274 denotes a p-type silicon substrate; 275 and 275' n⁺-type regions serving as base regions of the bipolar transistors; 276 an n⁻-type epitaxial region; 277 a p-type region to electrically isolate the bipolar transistors 271 and 272; 278 a selective oxide region; 279 and 279' base lead-out layers; 280 and 280' p⁺-type emitter regions; 281 and 281' p⁺-type collector regions; 282 an inter-layer insulative layer; 283, 284, 285, 286, and 287 Al electrodes; and 288 a passivation insulative layer.

The above bipolar transistors of the bulk vertical and lateral types need the element isolation regions each for electrically isolating the adjacent bipolar transistors, so that there is a problem such that a high integration degree cannot be obtained.

Each of the above bipolar transistors of the bulk vertical and lateral types needs the contact and wiring for connecting the collectors or emitters of the adjacent bipolar transistors or for connecting the collector of one of the adjacent bipolar transistors and the emitter of the other bipolar transistor. There is, consequently, a problem such that a contact resistance, a wiring resistance, and a wiring capacity become loads and the operating speed of the transistor is limited.

SUMMARY OF THE INVENTION

It is an object of the invention to provide a semiconductor device which reduces a parasitic capacity and has characteristics superior to those of a conventional bipolar transistor.

Another object of the invention is to provide a lateral type bipolar transistor which can not only improve a driving ability but also maintain a withstanding voltage.

Still another object of the invention is to provide a transistor which can be highly integrated and which can operate at a high speed.

Further another object of the invention is to provide a semiconductor device having a semiconductor which has source and drain regions, a channel region, a gate insulative film, and a gate electrode and in which the gate electrode is connected to a part of the channel region and the channel region has the same conductivity type as that of the source and drain regions and has an impurity concentration lower than that of the source and drain regions.

Further another object of the invention is to provide a semiconductor device including a MOS transistor and a bipolar transistor formed on an insulative substrate, wherein the MOS transistor has a gate electrode of the conductivity type opposite to the conductivity type of the MOS transistor, and there is also formed a lateral type bipolar transistor in which the gate electrode of the MOS transistor is electrically connected to a region under the gate of the MOS transistor through a contact region, thereby forming a base electrode.

Further another object of the invention is to provide a semiconductor device including at least two transistors formed on an insulative substrate, wherein at least one of a collector, an emitter, a source, and a drain of the first transistor among those transistors and at least one of a collector, an emitter, a source, and a drain of the second transistor adjacent to the first transistor are formed by the same diffusion region or are electrically connected through the same electrode contact region.

BRIEF DESCRIPTION OF THE DRAWINGS

FIG. 3 is a diagram showing a flow of a Bi-CMOS process;

FIG. 18 is a diagram showing a processing flow of the embodiment 1 of the invention;

DETAILED DESCRIPTION OF THE PREFERRED EMBODIMENTS

Figure 1:
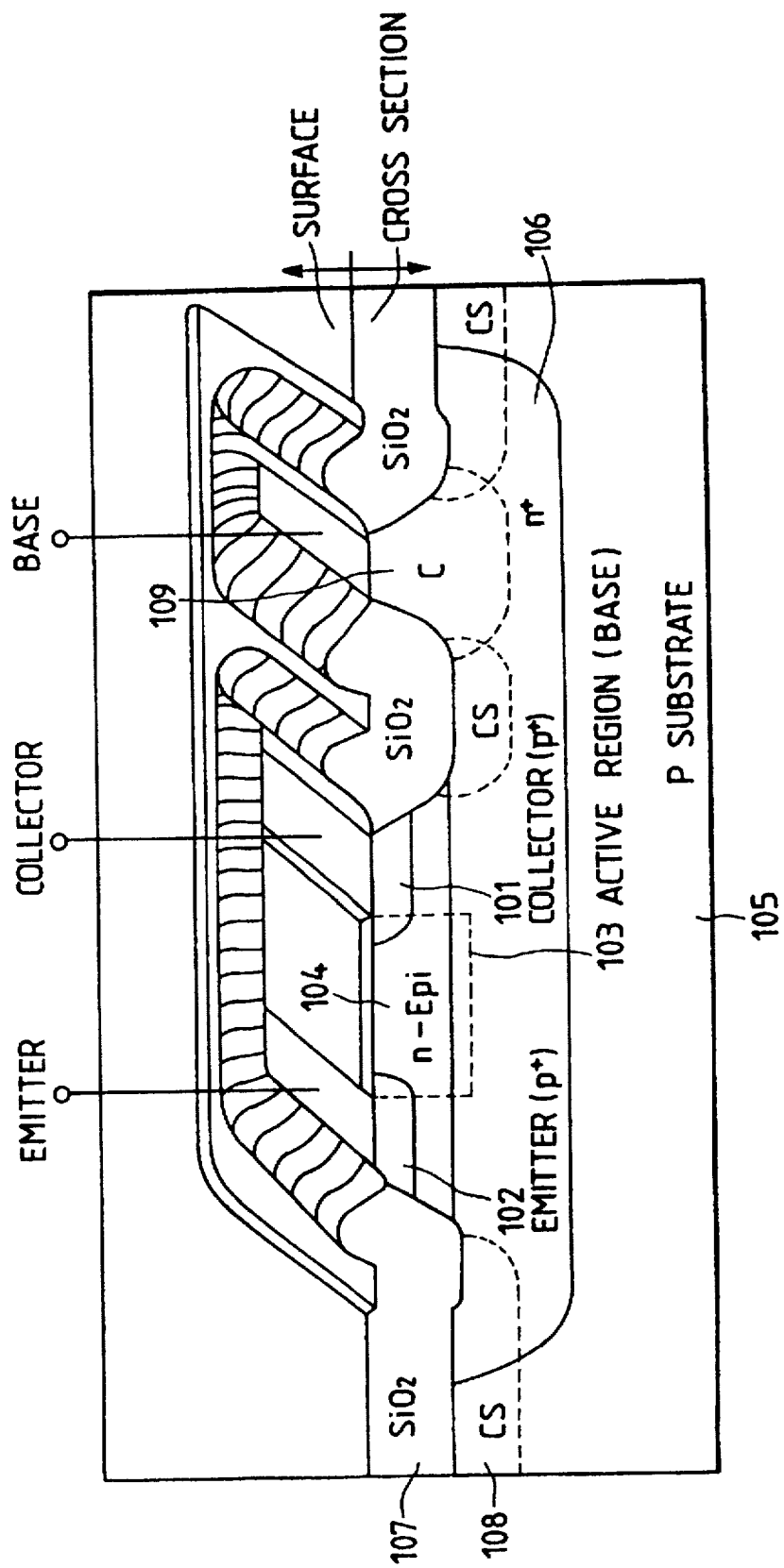
FIG. 1 is a conceptual diagram showing a lateral type pnp bipolar transistor.

According to the invention which accomplishes the above objects, a gate electrode is connected to a part of a channel region, the channel region has the same conductivity type as that of source and drain regions, and the channel region has an impurity concentration lower than that of the source and drain regions. Therefore, a majority carrier device can be formed instead of a minority carrier device like a bipolar transistor. Carrier movement is due to a drift instead of diffusion. Consequently, response characteristics of the semiconductor device can be improved.

According to the invention which accomplishes the above objects, an MOS transistor having a gate electrode of the conductivity type opposite to that of the MOS transistor is formed and, at the same time, a lateral type bipolar transistor in which the gate electrode of the MOS transistor directly come into contact with a well to thereby form a base electrode is also formed. Therefore, a complementary BiC-MOS semiconductor device can be formed by a simple process such that a base contacting step and a gate ion implanting step are merely added to the standard CMOS process. Thus, the manufacturing step can be remarkably reduced.

Further, since the MOS transistor and the bipolar transistor are formed on the insulative substrate, those devices can be electrically isolated by only a selective oxidizing step and a complementary BiCMOS semiconductor device of a high integration degree can be formed.

According to the invention, since the lateral type bipolar transistor in which the gate electrode of the MOS transistor directly come into contact with the well to thereby form the base electrode is formed on the insulative substrate, the characteristics as a feature of the MOS transistor formed on the insulative film such that even when the well concentration is reduced by decreasing the channel length, the channel is electrically fixed, so that the punch through withstanding voltage between the source and the drain can be highly maintained and be adapted as they are to the lateral type bipolar transistor. That is, even when the gate length of polysilicon serving as a base width is reduced, or even when the concentration of the p well serving as a base region is decreased, the punch through withstanding voltage between the emitter and the collector can be highly maintained. Therefore, the lateral type bipolar transistor in which a power source voltage on the collector side is high, a current amplification factor is high, and a high frequency cut-off frequency is high can be realized. Since the well serving as a base region is formed on the insulative film, the parasitic capacity of the base is small. Further, parasitic capacities of the emitter and collector also similarly small. Consequently, a high-speed transistor can be realized.

According to the invention which accomplishes the above objects, further, since the lateral type bipolar transistor is formed in the semiconductor layer on the insulative film, when the collectors or emitters of the adjacent bipolar transistors are connected, there is no need to isolate the elements and to provide a wiring, and a bipolar transistor semiconductor device of a high integration degree and a high speed can be realized. It is sufficient that the size of the region which is electrically connected through the same diffusion region of the collectors, emitters, sources, or drains of the adjacent transistors or the same electrode contact region is determined so as to satisfy the following relation $$\tau < 1/(2\pi f_T)$$

between the product of a parasitic resistance and a parasitic capacity of such a region, namely, a time constant $\tau$ and a high frequency cut-off frequency $f_T$ of the transistor.

The present invention will now be described in more detail hereinbelow with respect to specific embodiments. The invention, however, is not limited to those embodiments.

(Embodiment 1)

Figure 8A:
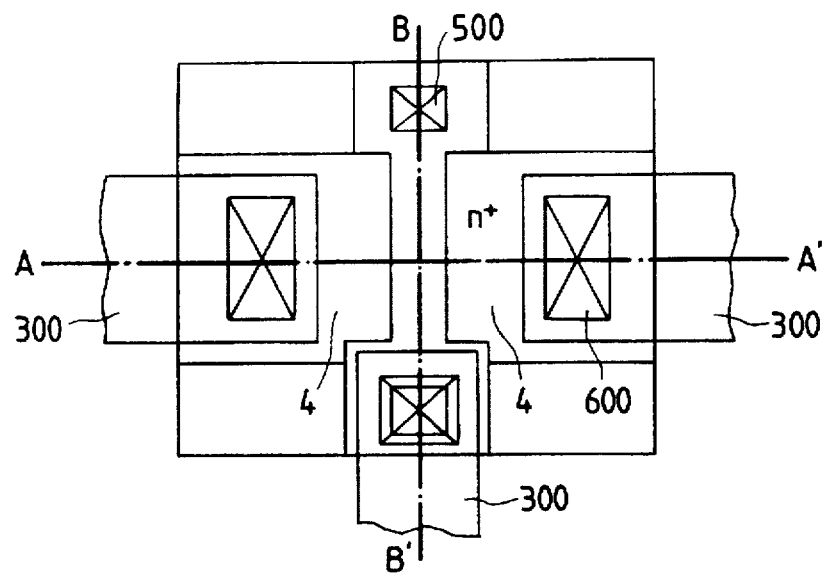
FIGS. 8A to 8C are conceptual diagrams of a semiconductor device according to the embodiment 1.
Figure 8B:
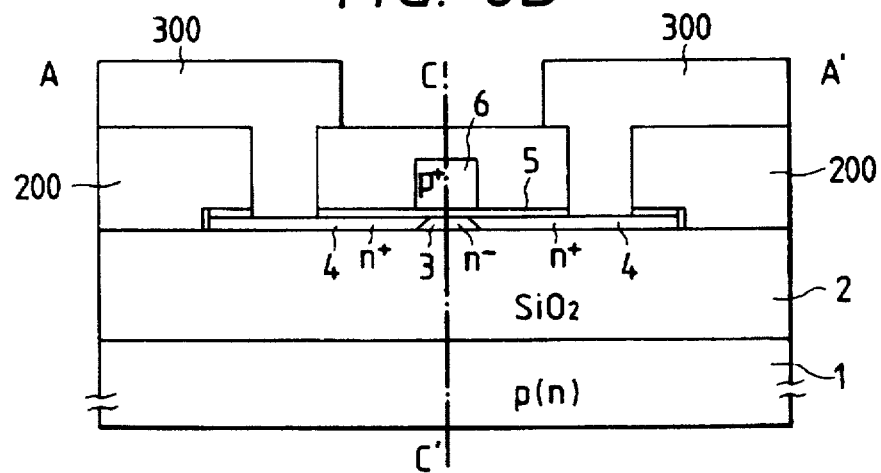
Figure 8C:
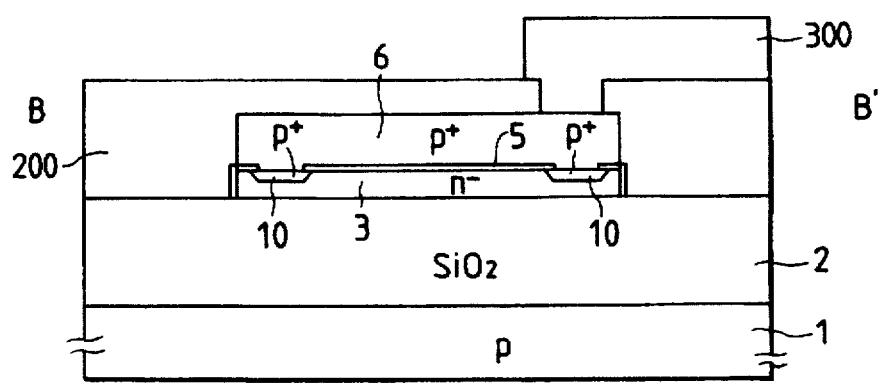

An embodiment of the invention will be described with reference to FIGS. 8A to 8C. In the drawings, FIG. 8A is a plan view. FIG. 8B is a cross sectional view taken along the line A-A' in FIG. 8A. FIG. 8C is a cross sectional view taken along the line B-B' in FIG. 8A.

An insulative layer 2 made of oxide silicon is formed on a p-type silicon substrate 1. Source and drain regions 4 made of an n$^+$-type silicon semi-conductor of an impurity concentration within a range from $10^{17}$ to $10^{20}$ cm$^{-3}$ and a channel region 3 made of an n$^-$-type silicon semiconductor of an impurity concentration within a range from $10^{13}$ to $10^{18}$ cm$^{-3}$ are formed on the insulative layer 2. A gate electrode 6 made of a p$^+$-type polycrystalline silicon semiconductor of an impurity concentration within a range from $10^{18}$ to $10^{21}$ cm$^{-3}$ is formed over the regions 4 and 3 through a gate insulative film 5. The gate electrode 6 is connected to a part of the channel region through p$^+$-type semiconductor regions 10. Thus, a transistor is formed by a semiconductor in which the channel region 3 has the same conductivity type as that of the source and drain regions 4 and has an impurity concentration lower than that of the source and drain regions 4.

Reference numeral 200 denotes a silicon oxide film serving as an element isolation region and an inter-layer insulative layer. Reference numeral 300 denotes a wiring made by, for instance, Al, Al-Si, Cu, Al-Si-Cu, W, Ti, Mo, or Ta, or silicide or polycide of each of them.

The distance between the p$^+$-type semiconductor regions 10 is set to a value which is equal to or less than two times of a diffusion length of the minority carrier in the channel, more preferably, one time or less. Although three or more regions can be formed as a region connecting the gate electrode and the channel, it is also designed so that the interval between those regions in this case is set to a value which is equal to or less than two times of the diffusion length of the minority carrier in the channel, more preferably, one time or less. By setting the distance between the p$^+$-type semiconductor regions to a value which is equal to or less than two times of the diffusion length of the minority carrier, the injection of holes from the gate into the channel is promoted and space charges are neutralized, so that it is possible to prevent that a space charge limiting current becomes dominant. The operation of a larger current density can be performed. Further, by setting the distance to a value shorter than the diffusion length of the minority carrier, the above effect is moreover enhanced.

Figure 9A:
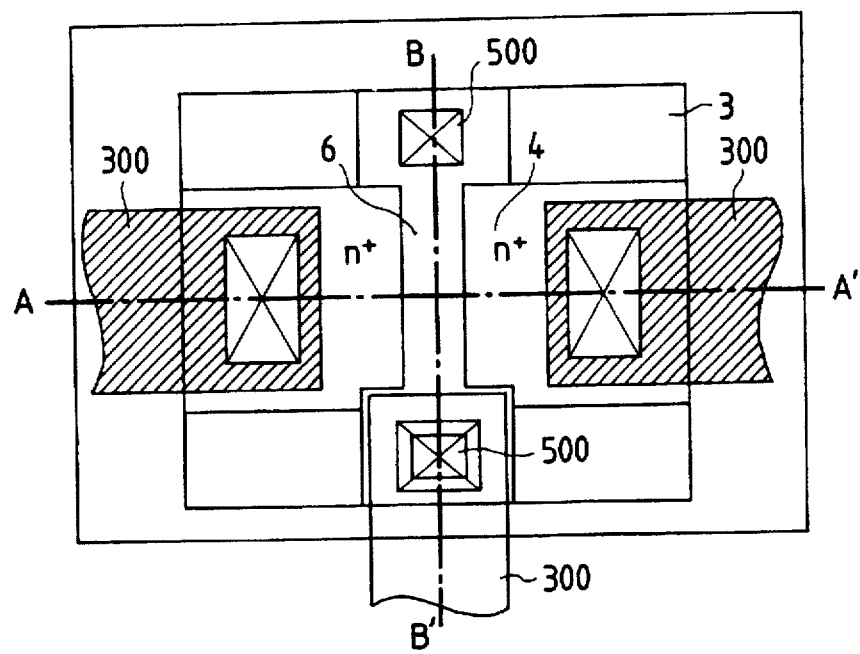
FIGS. 9A to 9C are conceptual diagrams of a semiconductor device according to the embodiment 2.
Figure 9B:
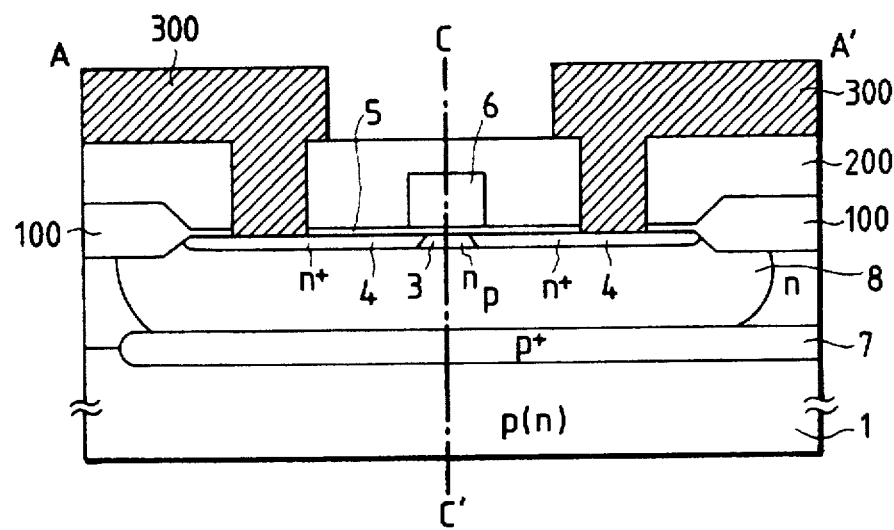
Figure 9C:
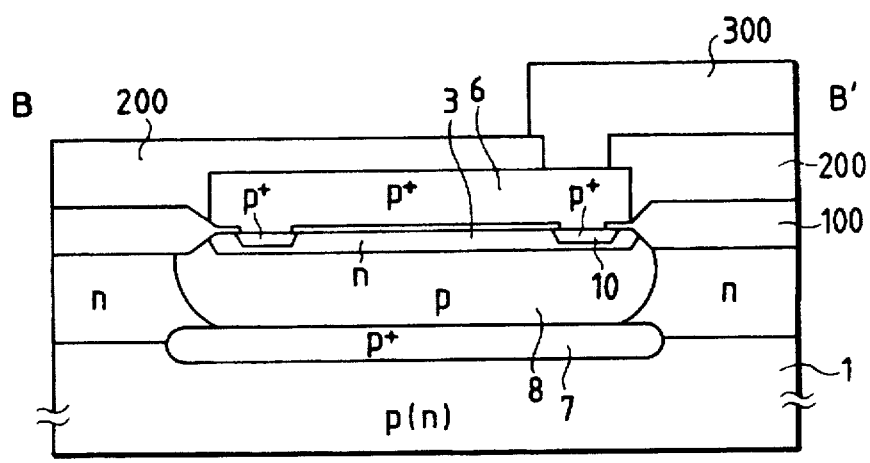

A region whose impurity concentration is higher than that of the channel region 3 and is lower than that of the drain region 4 is provided between the drain region 4 and the channel region 3 like an LDD (Lightly Doped Drain) structure, thereby enabling an adverse influence by the hot carrier. Although the transistor has been formed on the layer (SiO$_2$ layer) 2 having the insulative surface in the embodiment, it can be also formed on a p-type semiconductor layer as shown in FIGS. 9A to 9C.

It will be obviously understood that a transistor containing holes as majority carrier is formed by replacing the conductivity type of each region in each of the transistors described above.

Figure 10A:
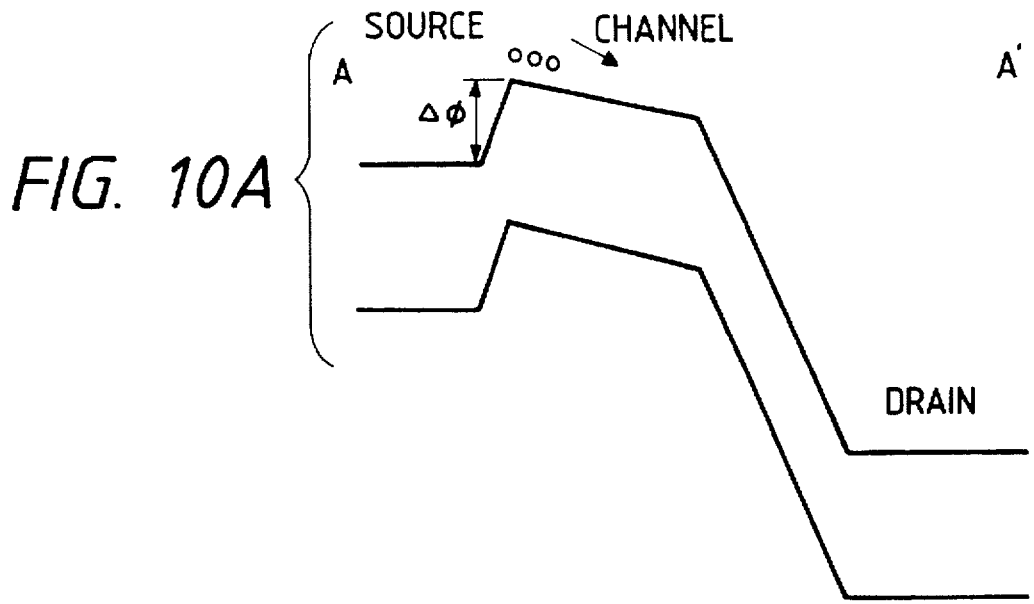
FIGS. 10A to 10C are schematic diagrams showing potential distributions of the transistor shown in FIGS. 8A to 8C.
Figure 10B:
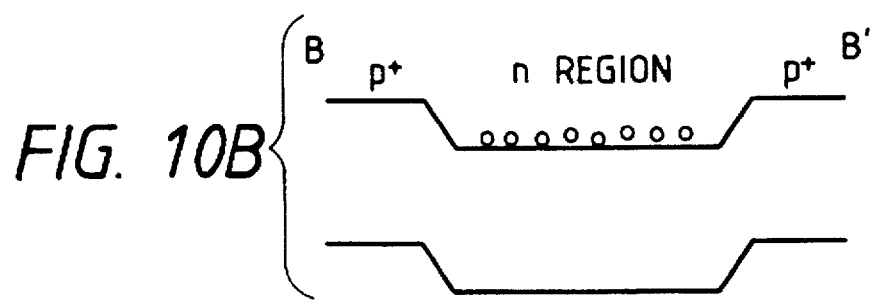
Figure 10C:
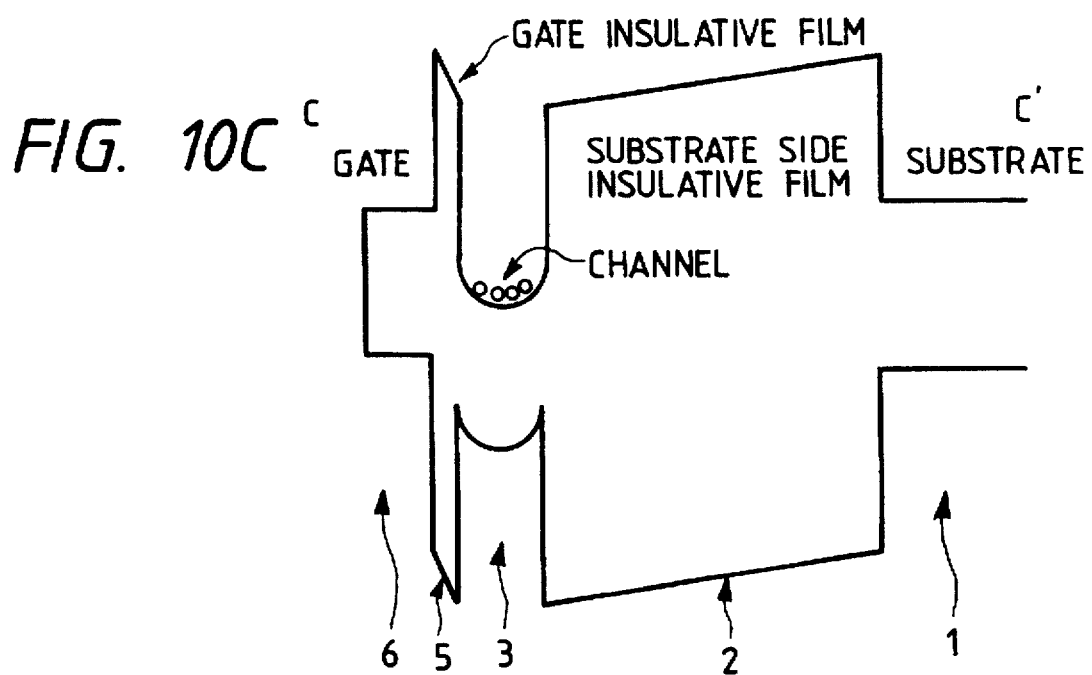

FIGS. 10A to 10C are schematic diagrams showing potential distributions of the transistor shown in FIGS. 8A to 8C. FIGS. 10A, 10B, and 10C correspond to the cross sectional directions taken along the lines A-A', B-B', and C-C' of FIGS. 8A to 8C, respectively. The transistor of the embodiment is of the normally-off type and the channel region 3 is perfectly depleted.

The operation of the transistor in the embodiment of FIGS. 8A to 8C will now be described. The normally-off conditions of the transistor and the conditions to have the neutral region are as follows.

1. Conditions in which the channel (base) region 3 is depleted (normally-off conditions):

A thickness $w_1$ of depletion layer extending from the gate electrode side is expressed by the following equation (1).

$$w_1 = (\epsilon_S/\epsilon_{OX}) t_{OX1} [-1 + \{1 + (\epsilon_{OX}^2/t_{OX1}^2)(2V_1/q\epsilon_S N_D)\}^{1/2}] \quad (1)$$

$\epsilon_S$: dielectric constant of the semiconductor
$\epsilon_{OX}$: dielectric constant of the oxide film
$t_{OX1}$: thickness of the gate oxide film 5
q: charges
$N_D$: impurity concentration of the channel (base) region 3
$V_1$: potential difference between the gate and the channel On the other hand, a thickness $w_2$ of the depletion layer extending from the substrate side is expressed by the following equation (2).

$$w_2 = (\epsilon_S/\epsilon_{OX}) t_{OX2} [-1 + \{1 + (\epsilon_{OX}^2/t_{OX2}^2)(2V_2/q\epsilon_S N_D)\}^{1/2}] \quad (2)$$

$\epsilon_S$: dielectric constant of the semiconductor
$\epsilon_{OX}$: dielectric constant of the oxide film
$t_{OX2}$: thickness of the oxide film (layer 2)
$V_2$: potential difference between the channel and the substrate Therefore, now assuming that a thickness of channel region is set to d, the condition in which the channel is depleted is $$d \leq w_1 + w_2 \quad (3)$$

In the embodiment, since the gate electrode 6 is connected to the channel 3 in the p$^+$-type semiconductor region 10, the potentials of the channel 3 and the gate electrode 6 are equal, so that the value of $V_1$ is substantially determined by a Fermi level difference $\phi_{ms}$ between the gate electrode (p$^+$) and the channel (n$^-$). In the embodiment of FIG. 1, in case of SOI, since the value of $t_{OX2}$ is generally equal to or larger than ten times of the value of $t_{OX1}$ of the gate oxide film, the thickness $w_2$ is hardly extended in many cases.

Therefore, as a sufficient condition in which the equation (3) is satisfied, it is preferable to set $$d \leq w_1 \quad (V_1 = \phi_{ms})$$

by assuming that $V_1 \rightarrow \phi_{ms}$.

Figure 2A:
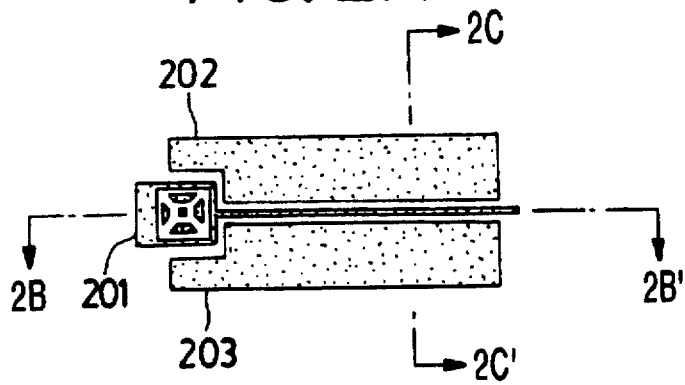
FIGS. 2A, 2B, and 2C are conceptual diagrams showing a lateral type pnp bipolar transistor with a gate.
Figure 2B:
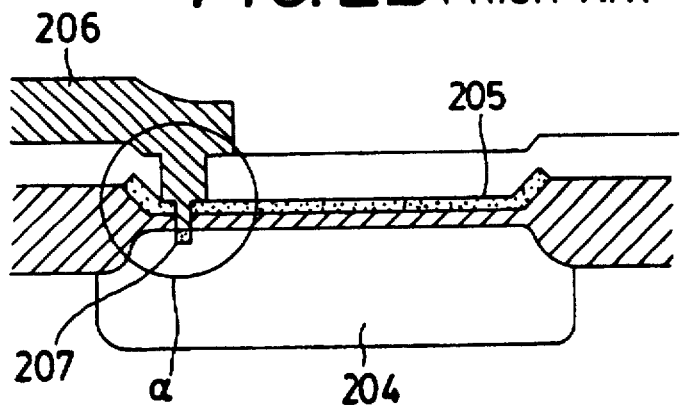
Figure 2C:
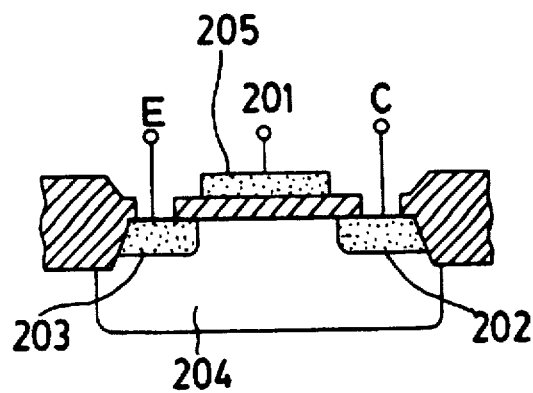
Figure 4A:
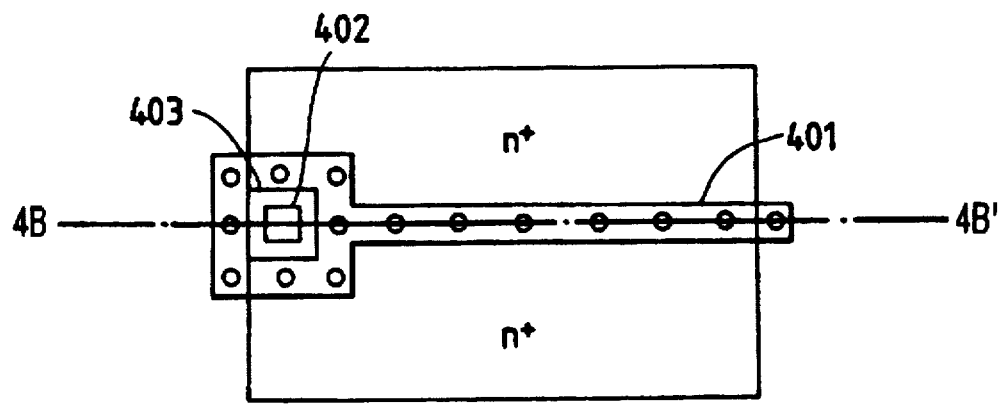
FIGS. 4A and 4B are conceptual diagrams showing a lateral type pnp bipolar transistor.
Figure 4B:
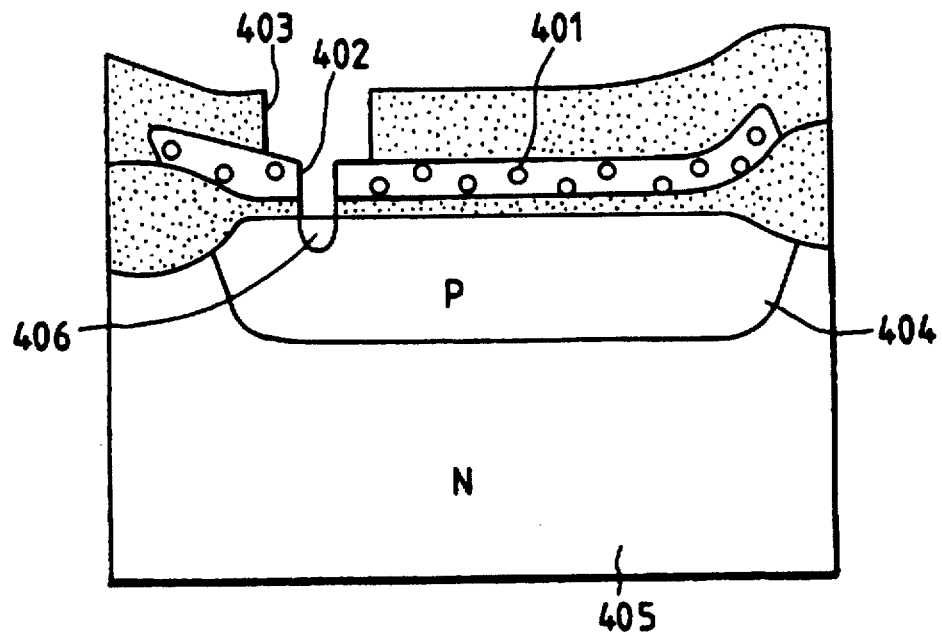
Figure 5:
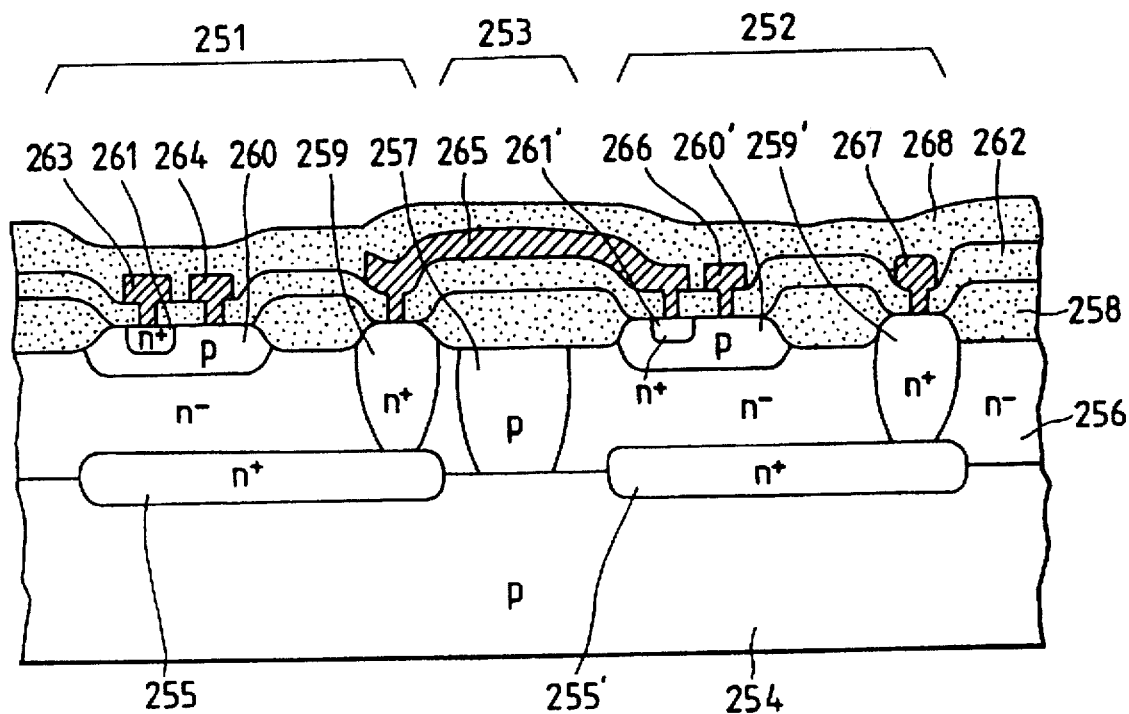
FIG. 5 is a schematic diagram showing a vertical type bipolar transistor.
Figure 6:
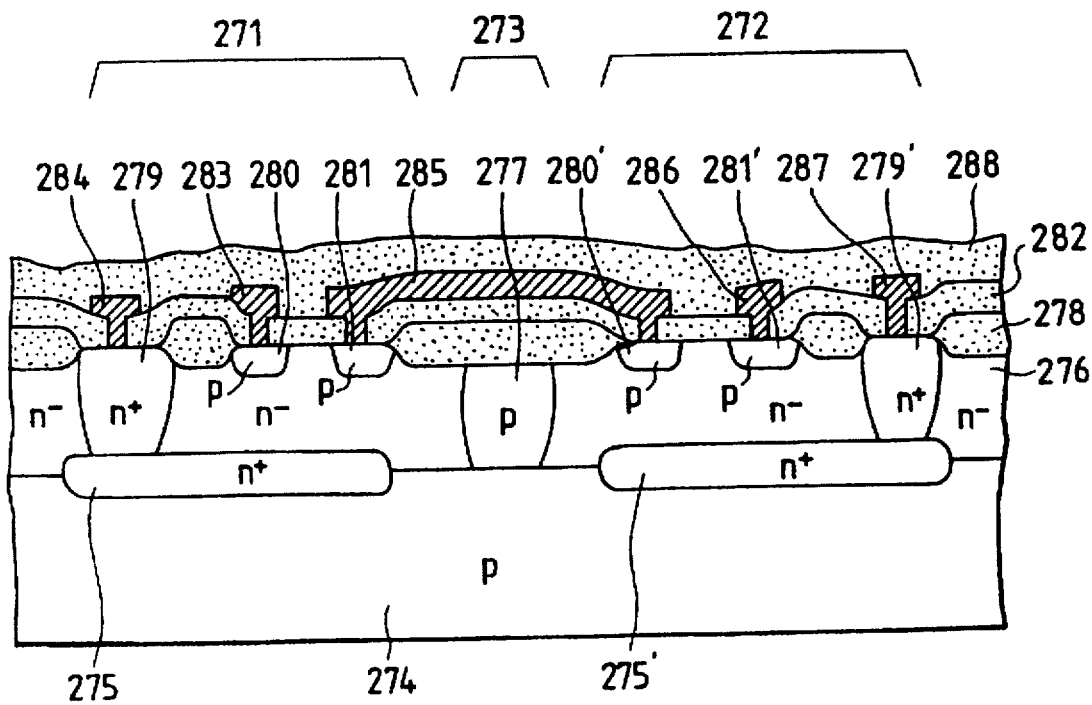
FIG. 6 is a schematic diagram showing a lateral type bipolar transistor.

2. Conditions in which the channel (base) has a neutral region:

$$d > w_1 + w_2 \quad (\text{FIG. 2}) \quad (4)$$

$$d > w_1 \quad (\text{FIG. 1})$$

A phenomenon in the case where the channel mentioned in the above item 1 is depleted will now be described.

As shown in a potential diagram of FIG. 10A, in the case where the whole portion in the channel is depleted, a barrier shown by $\Delta\phi$ exists between the source and channel portions and a concentration $n_{ch}$ of the carrier which is implanted into the channel is $$n_{ch} = N_{DS} \cdot \exp\{-(\Delta\phi/kT)\} \quad (5)$$

$N_{DS}$: impurity concentration in the source 4
$\Delta\phi$: height of the potential barrier
The above carrier drifts and becomes a current.

$$I_D = W \cdot d \cdot q \cdot n_{ch} \cdot \mu_{ch} \cdot (V_D/L) \quad (6)$$

w: gate width
d: channel thickness
$\mu_{ch}$: carrier mobility
L: gate length
$V_D$: voltage applied to the drain When the drain voltage $V_D$ is set to a certain value, a saturation voltage $V_{DS}$ is obtained and a drain current $I_D$ is saturated.

The value of $\Delta\phi$ can be substantially decided by the gate oxide film thickness $t_{OX1}$, channel concentration $N_D$, channel thickness d, gate voltage $V_G$, and the like.

In the case where the neutral region remains in the channel, the following phenomenon occurs.

When the neutral region remains, the impurity concentration of the channel is set to a carrier concentration and the current can be linear approximately determined by the thickness of neutral region and the gate width. That is, $$I_{Dn} = W(d - w_1 - w_2) \cdot q \cdot N_D \cdot \mu_{ch} \cdot (V_D/L) \quad (7)$$

$N_D$: impurity concentration of the channel
Similarly, when $V_D$ is set to a certain value, the saturation voltage $V_{DS}$ is obtained and a drain current $I_{Dn}$ is saturated.

In the invention, when the whole portion in the channel is depleted, the normally-off characteristics are shown. When the channel is partially depleted, the device becomes the normally-on type.

In the majority carrier device as well, when a current density is set to a large value, the space charge effect becomes a problem, particularly, in the normally-off type. Namely, when $$n_{ch}=N_{DS}\exp\{-(\Delta\emptyset/kT)\}\geq N_D \qquad (8)$$

the channel resistance increases due to the space charge effect and, even when the gate voltage is raised, the current saturation characteristics are shown. Such a phenomenon can be prevented according to the invention. That is, this is because since the gate directly comes into contact (connected) with the channel, the holes are injected from the gate into the channel and are neutralized, the space charge limiting current does not become dominant. In this instance, when the distance of the direct contact is equal to or less than about two times of the diffusion length of the minority carrier, a neutralizing effect is sufficiently obtained.

An example of the manufacturing process of the semiconductor device of the embodiment will now be described.

(1) An SOI substrate having the insulative film 2 on the p-type or n-type Si substrate and having the thin film semiconductor layer is prepared.

(2) A masking is performed by a resist, a part of the thin film semiconductor layer is selectively removed by a reactive ion etching, and an element isolation is executed.

(3) The gate oxide film 5 having a thickness of about 50 to 1000 Å is formed. After that, ions of arsenic (As), phosphorus (P), or the like of a concentration of about $1\times10^{11}$ to $1\times10^{14}$ cm$^{-2}$ are implanted so as to have a predetermined channel concentration and a heat treatment (temperature: 900° to 1000° C.) is executed, thereby forming the region 3.

(4) An opening portion of a contact 500 is formed in the gate oxide film 5. After that, a polysilicon layer having a thickness of 2000 to 4500 Å is deposited by a low pressure chemical vapor deposition method (LPCVD). Ions of B$^+$, BF$^+$, or the like of a dose amount within a range from $5\times10^{14}$ to $2\times10^{16}$ cm$^{-2}$ are implanted. After that, a heat treatment is executed at temperatures of about 900° to 1050° C. and a patterning is subsequently performed, thereby forming the gate electrode 6.

By the above heat treatment, the p-type impurities pass from the polysilicon layer through the opening portion 500 and are diffused into the Si layer, so that the p$^+$ region 10 is formed.

(5) Ions of either one of As, P, Sb (antimony), and the like serving as n-type impurities are implanted by a dose amount of about $1\times10^{15}$ to $1\times10^{16}$ cm$^{-2}$. The n$^+$ region 4 is selectively formed by the polysilicon gate 6 in a self-alignment manner. A heat treatment (temperature; 900° to 1050° C.) is executed, thereby activating the impurities.

(6) An SiO$_2$ layer containing boron, phosphorus, or the like and serving as an inter-layer insulative layer 200 is deposited by an atmospheric pressure CVD method until a thickness of about 2000 to 8000 Å. After that, a heat treatment is executed at a temperature of 900° to 1000° C. Subsequently, a patterning is executed by using a resist and the. SiO$_2$ layer is selectively removed by a reactive ion etching (RIE), a wet etching by a buffer hydrofluoric acid, thereby opening a contact hole 600 or the like.

(7) After an (Al—Si) layer having a thickness of about 1 µm was deposited by a sputtering, it is patterned and a heat treatment is executed at a temperature of 400° to 450° C., thereby completing a semiconductor device.

(Embodiment 2)

FIGS. 9A to 9C are diagrams for explaining the second embodiment of the invention. FIG. 9A is a plan view. FIG. 9B is a cross sectional view taken along the line A-A' in FIG. 9A. FIG. 9C is a cross sectional view taken along the line B-B' in FIG. 9A. In the diagrams, reference numeral 1 denotes the p-type or n-type Si semiconductor substrate; 7 a p$^+$ buried layer of a high concentration of about $10^{15}$ to $10^{19}$ cm$^{-3}$; 8 a p-type diffusion layer of about $10^{15}$ to $10^{18}$ cm$^{-3}$; 3 the channel region in which the carrier (electrons) which is injected from the source runs 10 and which is an n region of about $10^{13}$ to $10^{18}$ cm$^{-3}$; 4 the n$^+$ region of a high concentration of about $10^{17}$ to $10^{20}$ cm$^{-3}$ serving as a source or drain region; 5 the gate insulative film; and 6 the p$^+$-type polysilicon gate electrode having an impurity concentration of about $10^{18}$ to $10^{21}$ cm$^{-3}$.

As shown in FIG. 9C, the p$^-$ gate electrode 6 comes into contact with the channel region through the opening portion. Reference numeral 10 denotes the p$^+$ high concentration region and forms a junction in the channel.

Reference numerals 100 and 200 denote insulative films each serving as an element isolation or an inter-layer isolation; and 300 denotes a wiring.

A manufacturing process of the semiconductor of the embodiment shown in FIGS. 9A to 9C will now be explained.

(1) An oxide film of 500 Å is formed onto the p-type or n-type Si substrate 1. After that, B$^+$ ions of a dose amount of about $1\times10^{14}$ to $1\times10^{16}$ cm$^{-2}$ are partially implanted through a mask and a heat treatment is executed at a temperature of about 1000° to 1100° C., thereby forming the p$^+$ region 7.

(2) An n-type layer of an impurity concentration of about $10^{13}$ to $10^{18}$ cm$^{-3}$ is deposited by an epitaxial technique so as to have a thickness of about 1 to 5 µm. B$^+$ ions of about $1\times10^{12}$ to $1\times10^{14}$ cm$^{-2}$ are partially implanted. Subsequently, a heat treatment is executed at a temperature of about 1000° to 1150° C. and the impurities are activated and diffused, thereby forming the p-type region 8.

(3) The element isolation region 100 is formed by a selective oxidizing method. After that, a gate oxide film of about 50 to 1000 Å is formed.

(4) The element isolation region is used as a mask for self alignment and ions of arsenic (As$^+$) or phosphorus (P$^+$) of about $1\times10^{12}$ to $1\times10^{14}$ cm$^{-2}$ are implanted into only a predetermined region and a heat treatment is executed, thereby forming the region 3.

(5) The contact 500 is opened in the gate oxide film 5. After that, a polysilicon layer of 3000 Å is deposited by an LPCVD method. Subsequently, B$^+$ ions of about $1\times10^{15}$ to $1\times10^{16}$ cm$^{-2}$ are implanted, a heat treatment is executed at a temperature of 850° to 1050° C., and the polysilicon layer is patterned, thereby forming the gate electrode 6.

(6) Ions of P or As of a dose amount of $1\times10^{15}$ to $1\times10^{16}$ cm$^{-2}$ are implanted and a heat treatment is executed at a temperature of 900° to 1050° C., thereby forming the n$^+$ region 4. The active region 3 is formed by the self alignment by the polysilicon electrode 6.

The subsequent manufacturing method is substantially the same as that in the embodiment 1.

A potential diagram and operating characteristics of the device according to the embodiment are similar to those in the embodiment 1 except that the thickness $w_2$ of the depletion layer extending from the substrate side is expressed by the following equation (9).

$$w_2 = \{(2\varepsilon_s/q) \cdot (N_A/N_D) \cdot (V_2/(N_A+N_D))\}^{1/2} \quad (9)$$

$N_A$: impurity concentration on the substrate (region 8) side $V_2$: potential difference between the channel 3 and the substrate 1

Figure 11:
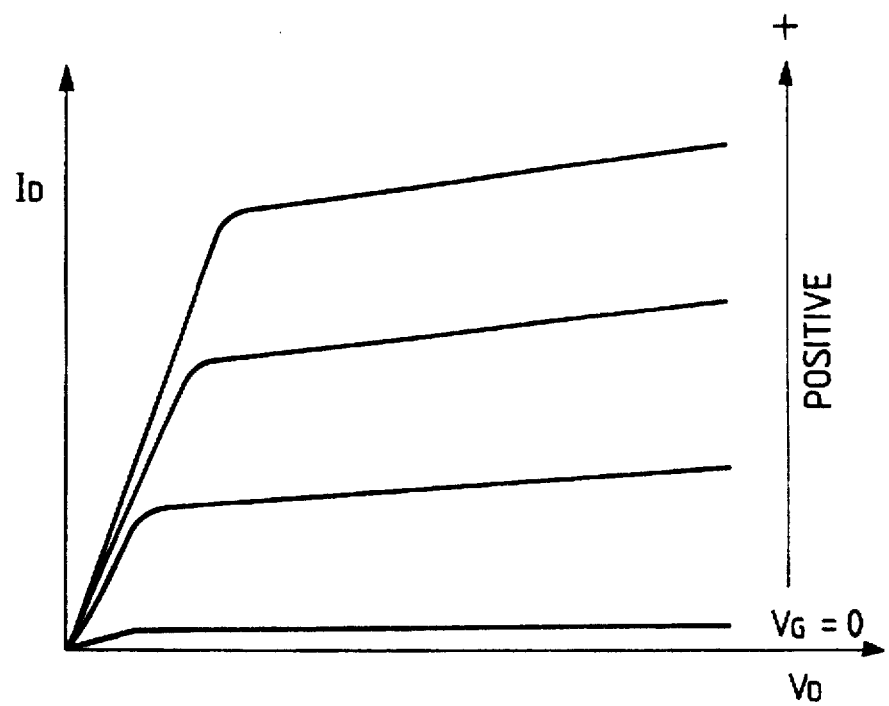
FIG. 11 is a graph showing current-voltage characteristics of the semiconductor device of the embodiment 2.

FIG. 11 shows current-voltage characteristics of the device obtained as mentioned above. In a manner similar to the embodiment 1, the normally-off characteristics are exhibited and good characteristics are obtained.

Although the normally-off type device has been manufactured in the embodiment, a normally-on type device can be also obviously formed.

(Embodiment 3)

Figure 12A:
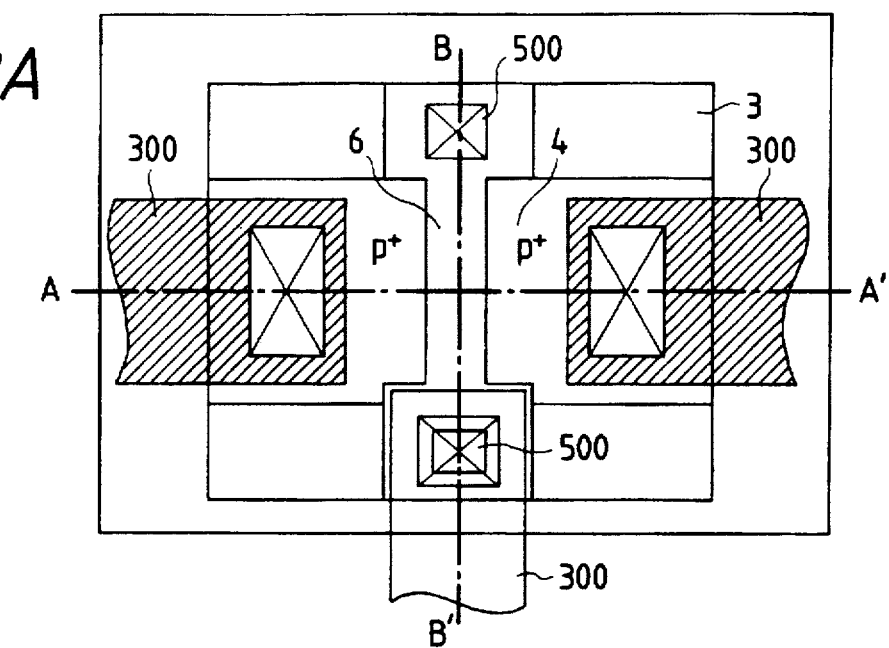
FIGS. 12A to 12C are conceptual diagrams of a semiconductor device according to the embodiment 3.
Figure 12B:
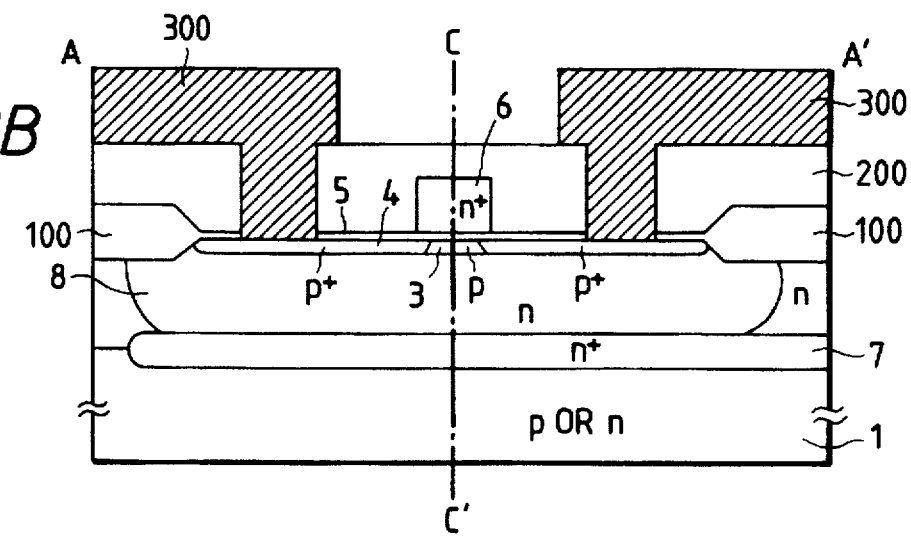
Figure 12C:
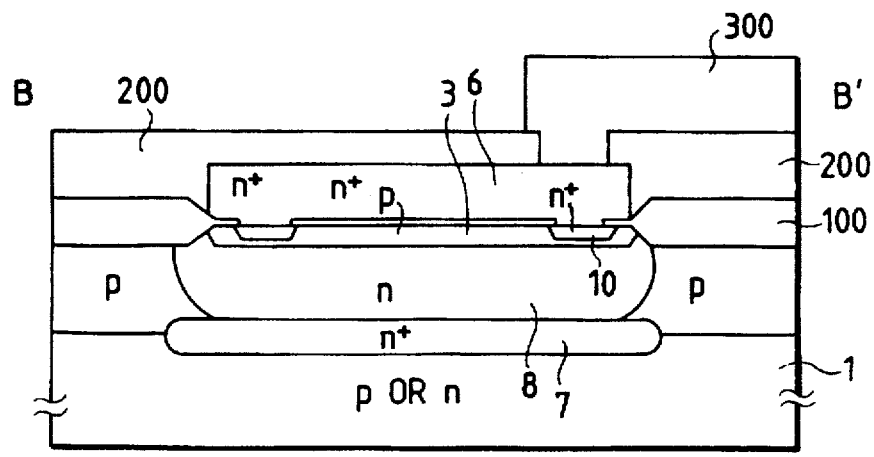

The embodiment 3 of the invention will now be described with reference to FIGS. 12A to 12C. In the drawings, FIG. 12A is a plan view, FIG. 12B is a cross sectional view taken along the line A-A' in FIG. 12A, and FIG. 12C is a cross sectional view taken along the line B-B' in FIG. 12A.

In the embodiment 3, a device such that the majority carrier of the conductivity type opposite to that of the embodiment 2 indicates holes is formed in a manner similar to the embodiment 2. The device obtained similarly exhibits good characteristics.

(Embodiment 4)

Figure 13A:
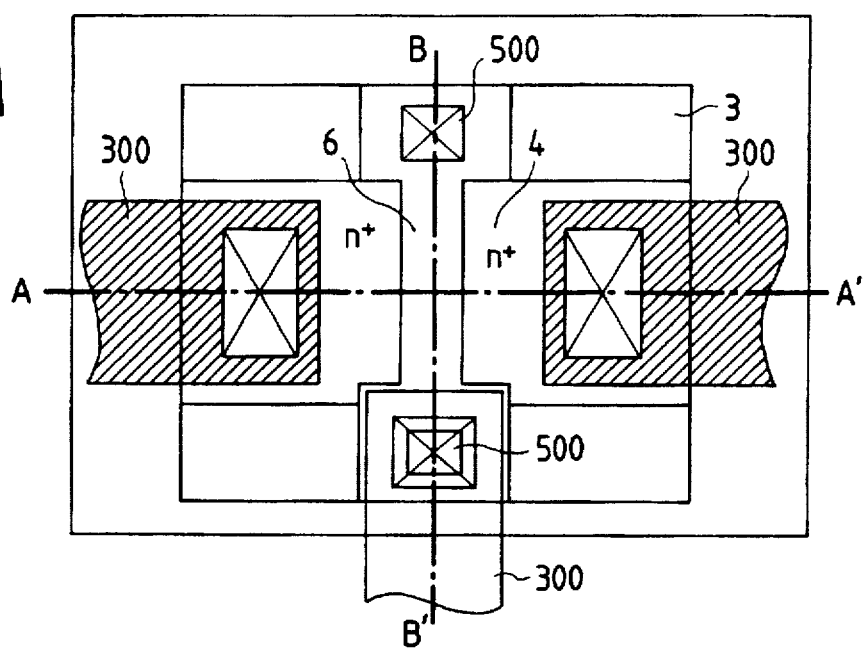
FIGS. 13A to 13C are conceptual diagrams of a semiconductor device according to the embodiment 4.
Figure 13B:
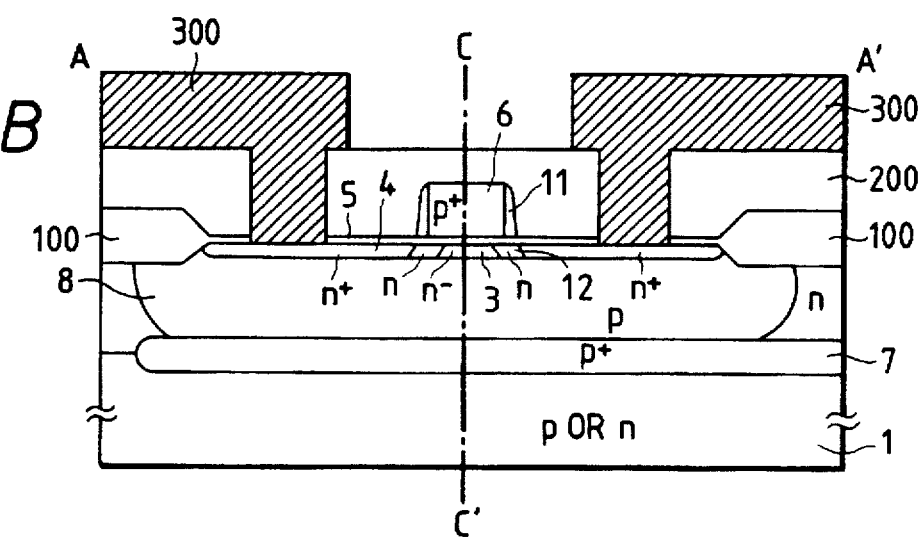
Figure 13C:
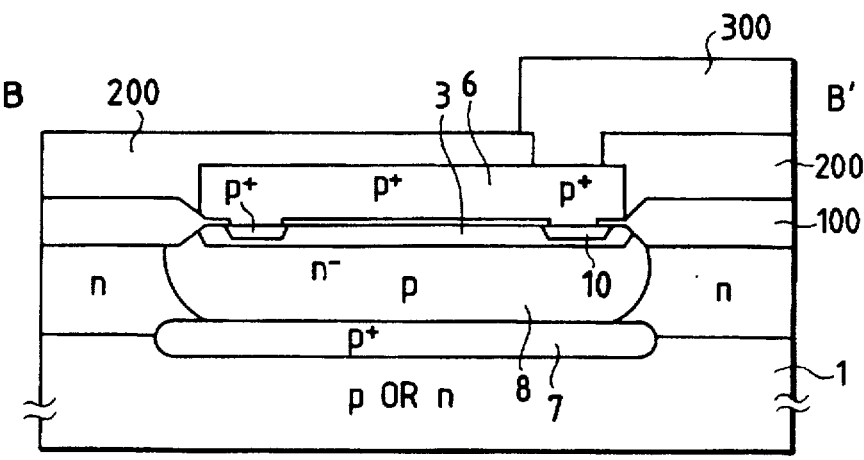

The embodiment 4 of the invention will now be described with reference to FIGS. 13A to 13C. In the embodiment 4, as shown in FIG. 13B, a spacer 11 is formed at a position adjacent to the gate electrode 6. A region 12 of an impurity concentration lower than that of the source or drain region. Thus, an electric field of the drain is reduced and the formation of the hot carrier can be suppressed. The withstanding voltage is improved and a deterioration can be reduced.

(Embodiment 5)

Figure 14A:
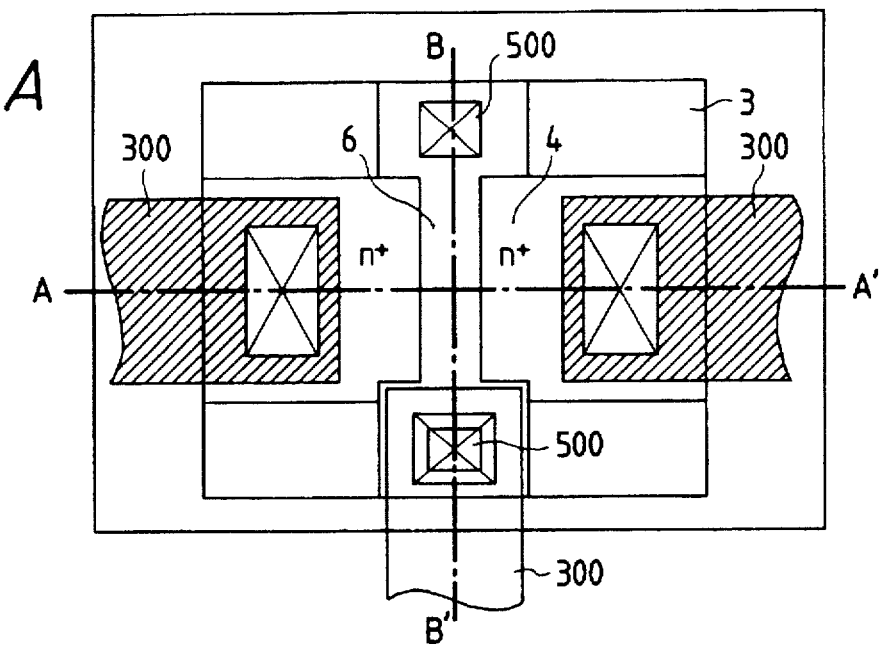
FIGS. 14A to 14C are conceptual diagrams of a semiconductor device according to the embodiment 5.
Figure 14B:
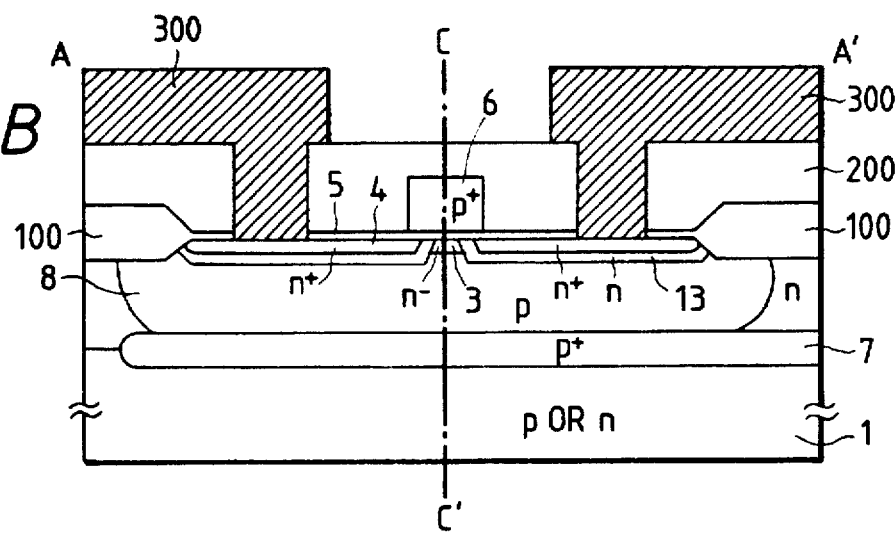
Figure 14C:
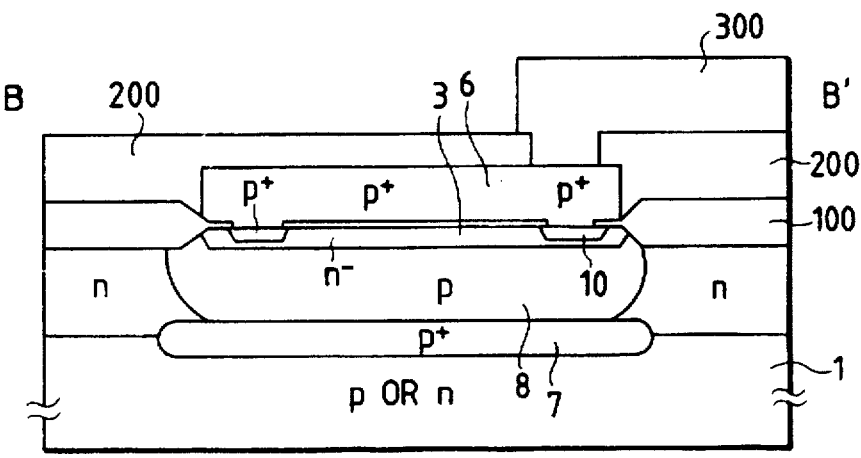

The embodiment 5 of the invention will now be described with reference to FIGS. 14A to 14C. As shown in FIG. 14B, a region 13 of an impurity concentration lower than that of the source or drain region is formed so as to surround the source and drain regions.

Due to this, in a manner similar to the embodiment 4, an electric field of the drain is reduced, the formation of the hot carrier can be suppressed, and the withstanding voltage can be improved.

(Embodiment 6)

Figure 15:
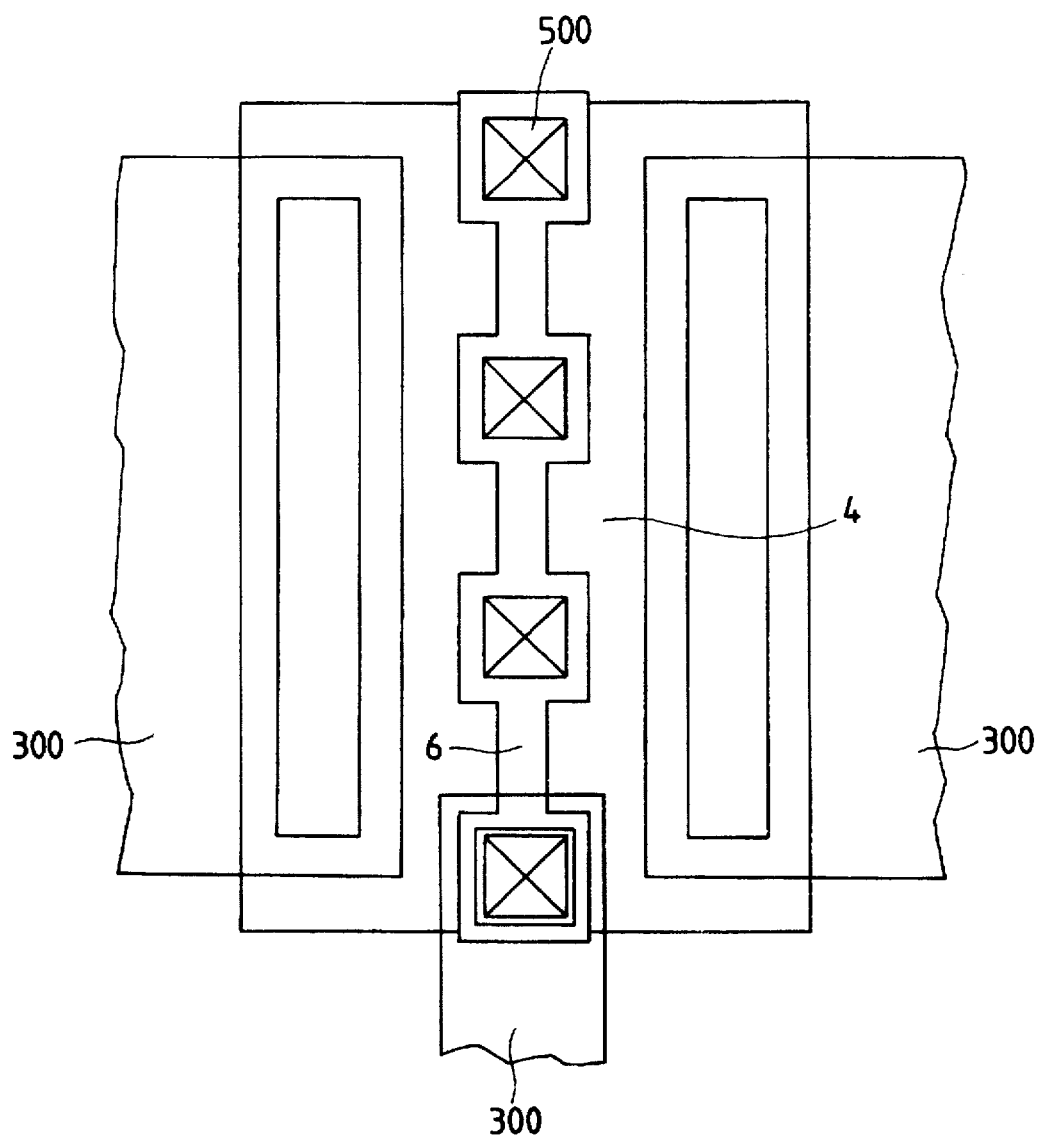
FIG. 15 is a conceptual diagram of a semiconductor device according to the embodiment 6.

The embodiment 6 of the invention will now be described with reference to a plan view of FIG. 15. In the embodiment 6, a plurality of contacts 500 which are connected to the channel are formed. By using such a structure, an efficiency of the potential control is improved and the device can cope with a long gate width. In this case, it is desirable to set the distance between the contacts to a value which is equal to or less than two times of the diffusion length of the minority carrier.

(Embodiment 7)

The embodiment 7 of the invention will now be described with reference to FIGS. 16 and 17.

Figure 16:
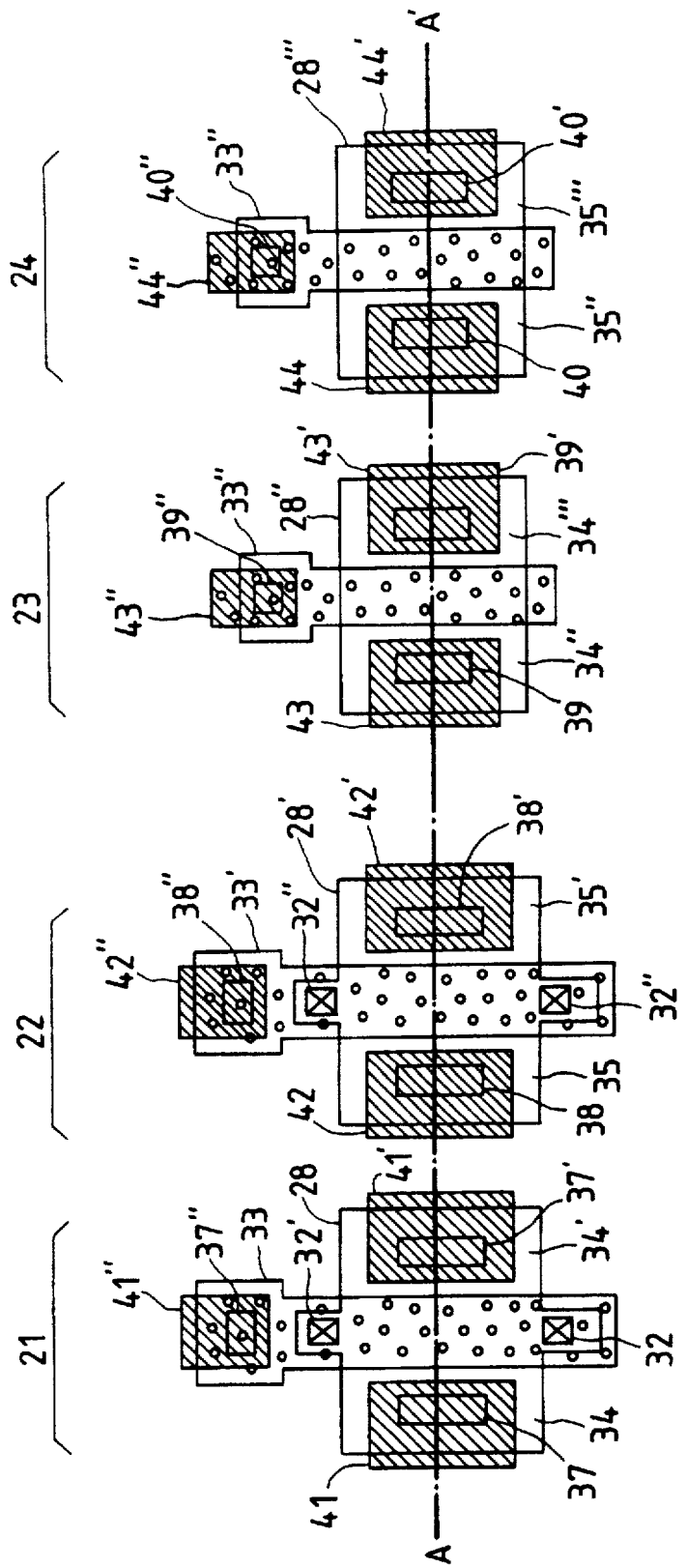
FIG. 16 is a schematic plan view showing the embodiment 7 of the invention.

FIG. 16 is a plan view showing a structure of the embodiment 7. FIG. 17 is a cross sectional structural view taken along the line A-A' in FIG. 16.

Figure 17:
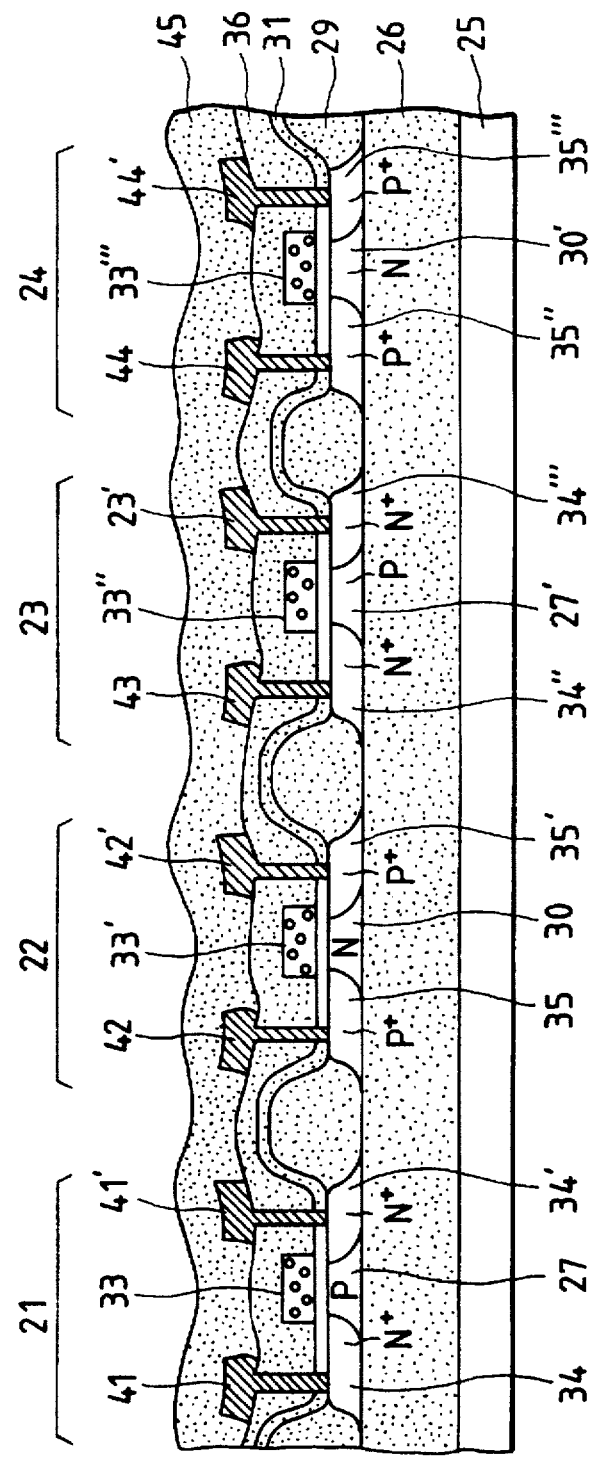
FIG. 17 is a schematic cross sectional view showing the embodiment 7 of the invention.

In FIGS. 16 and 17, reference numeral 21 denotes an npn-type bipolar transistor; 22 a pnp-type bipolar transistor; 23 an n-type MOS transistor; 24 a p-type MOS transistor; 25 a silicon substrate; 26 an insulative film; 27 and 27' silicon layers which were formed on the insulative film and subsequently constructed as p type; 28, 28', 28", and 28''' selective oxide (LOCOS) layer edges; 29 a selective oxide layer; 30, 30' n well regions; 31 a gate oxide film; 32, 32', 32", and 32''' base contacts; 33 and 33" p-type polysilicon layers into which boron was doped; 33' and 33''' n-type polysilicon layers into which phosphorus was doped; 34, 34', 34", and 34''' n⁺-type diffusion regions formed by implanting arsenic ions; 35, 35', 35", and 35''' p⁺-type diffusion regions formed by implanting boron ions; 36 an inter-layer insulative film; 37, 37', 37", 38, 38', 38", 39, 39', 39", 40, 40', and 40" contacts; 41 an Al layer serving as an emitter electrode; 41' an Al layer serving as a collector electrode; 41" an Al layer serving as a base electrode; 42 an Al layer serving as an emitter electrode; 42' an Al layer serving as a collector electrode; 42" an Al layer serving as a base electrode; 43 an Al layer serving as a source electrode; 43' an Al layer serving as a drain electrode; 43" an Al layer serving as a gate electrode; 44 an Al layer serving as a source electrode; 44' an Al layer serving as a drain electrode; 44" an Al layer serving as a gate electrode; and 45 a passivation film.

FIG. 18 is a processing flow to form a semiconductor device of the embodiment. That is, a silicon layer of an SOI substrate such as SIMOX wafer, laser recrystalline wafer, joined wafer, or the like is set to a p-type of a desired concentration. An element isolation is executed by an LOCOS selective oxidation. An n well serving as a p-type MOS channel region is formed. A gate oxidation is formed, a gate contact region is opened, and polysilicon is deposited. Boron ions are implanted into the regions of the npn bipolar transistor and NMOS in the polysilicon layer, thereby forming a p type. Phosphorus ions are implanted into the regions of the pnp bipolar transistor and PMOS in the polysilicon layer, thereby forming an n type. The polysilicon layer is subsequently patterned into a desired shape. Arsenic ions are implanted into the regions of the npn bipolar transistor and NMOS, thereby forming an n⁺ type, thereby forming an emitter, collector, source, or drain region. Boron ions are implated into the regions of the pnp bipolar transistor and PMOS, thereby forming a p⁺ type and forming an emitter, collector, source, or drain region. An inter-layer insulative film is subsequently deposited. A contact is opened. A metal layer is deposited. A patterning is performed. A passivation film is deposited. A pad patterning is executed. In this manner, the manufacturing process is completed. In this instance, all of the lower edges of the n well, p well, n⁺ diffusion region, and p⁺ diffusion region reach the back surface of the SOI silicon layer.

According to the manufacturing process of the embodiment, as compared with the conventional CMOS process, by merely adding the base patterning step and the ion implanting steps of the p-type and n-type impurities into the polysilicon layer, an npn bipolar transistor, a pnp bipolar transistor, an NMOS transistor, or a PMOS transistor, namely, a Bi-CMOS semiconductor device can be formed.

Figure 19:
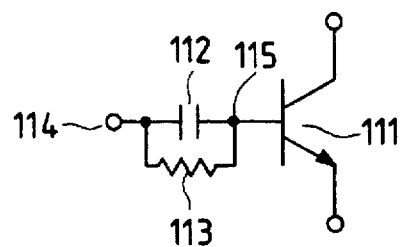
FIG. 19 is a circuit diagram showing an equivalent circuit of the embodiment 7 of the invention.

FIG. 19 is an equivalent circuit diagram of an npn type bipolar transistor of the invention. The bipolar transistor of the invention can be expressed by an MIS type capacitor 112 and a serial resistor 113 of a base region onto a base of a bipolar transistor 111. The capacitor 112 functions as a speed-up capacitor. Namely, when a pulse is applied to a base terminal 114, a potential at a base position 115 changes at a high speed by the capacitor 112. A collector current and an emitter current of the bipolar transistor 111 can be controlled at a high speed.

Figure 7A:
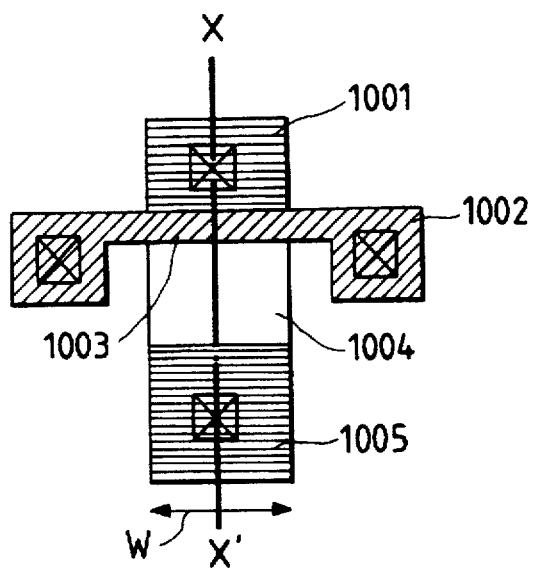
FIGS. 7A and 7B are schematic diagrams showing an SOI lateral type bipolar transistor.
Figure 7B:
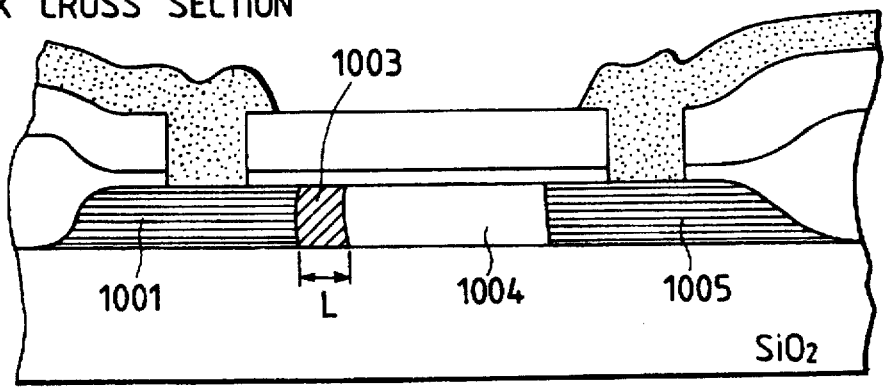

The above point will be described further in detail. FIGS. 7A and 7B show an SOI lateral type bipolar transistor as a comparison example. There is no MIS structure on a base region. FIG. 7A is a plan view. FIG. 7B is a cross sectional view taken along the line X-X' in FIG. 7A. A high base resistance exists in the bipolar transistor having such a structure. For example, now assuming that a base concentration is equal to $2 \times 10^{17}$ cm$^{-3}$, a thickness of SOI film is equal to 0.5 µm, a base length L is equal to 0.5 µm, and a width W is equal to 5 µm, a base resistance up to the base central portion is equal to 11 k$\Omega$. This value is high when considering that a channel resistance (gate oxide film thickness is set to 12 nm) of the MOS transistor of the same size is equal to 1 k$\Omega$. A capacity between the base and the emitter is equal to 3.3 fF. Even if an effective base resistance $R_B$ is reduced by obtaining base electrodes from both sides or the like, a time constant which is required to charge a capacitor $C_{BE}$ is equal to about 10 psec. A time constant (in a logic circuit or the like, this value corresponds to a leading time constant $t_1$ of an input signal) which is required to charge a gate capacitor of an MOS transistor of the same size by the MOS transistor of the same size is equal to about 7 psec. Therefore, the former time constant is slower than the latter time constant by about 40%. Such a slow time constant causes a serious problem in the Bi-CMOS semiconductor device which intends to realize a high-speed operation.

When a time constant $\tau_{BE}$ ($=C_{BE} \times R_B$) to charge the base-emitter capacitor is larger than $t_1$ ($\tau_{BE} > t_1$), the lateral type bipolar transistor of the invention which is directly coupled with the base region by an MIS type capacitor is particularly effective.

Figure 20:
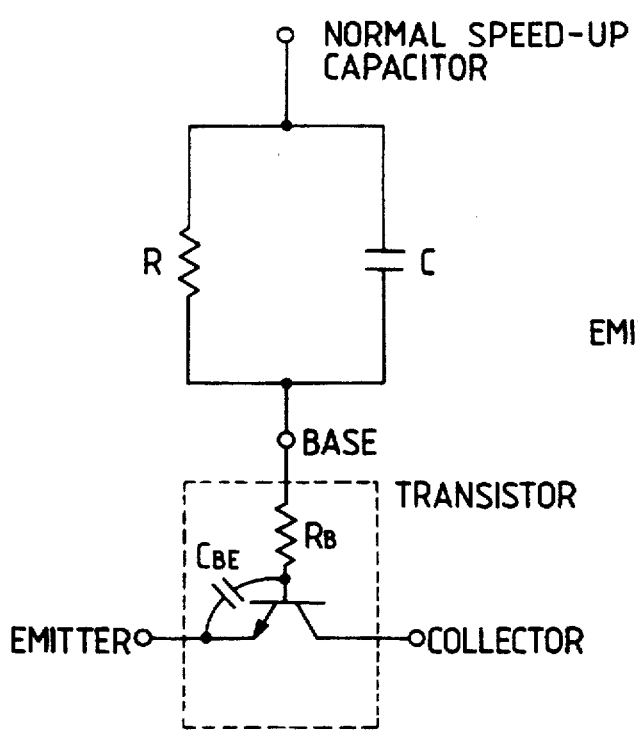
FIG. 20 is a circuit diagram using a speed-up capacitor.

According to the concept of the ordinary speed-up capacitor, as shown in FIG. 20, it is effective to a resistance delay by an external resistance R of the bipolar transistor such as high resistance wiring by polycrystalline silicon, resistance for compensation of a current value, or the like. It is, however, impossible to improve a resistance delay by a resistance $R_B$ or the like in the transistor.

Figure 21:
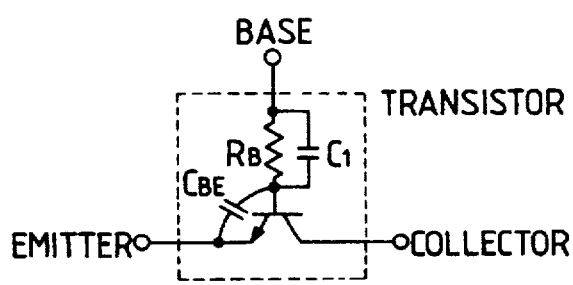
FIG. 21 is an equivalent circuit diagram of a lateral type bipolar transistor of the embodiment 7.

In the invention, however, since the bipolar transistor is of the lateral type, an MIS type capacitor $C_1$ is directly coupled to the base region as shown in an equivalent circuit diagram of FIG. 21. Thus, the capacitor $C_{BE}$ can be charged by the capacitive division of the capacitor $C_1$ and the delay due to the internal resistance $R_B$ can be also improved.

Figure 22A:
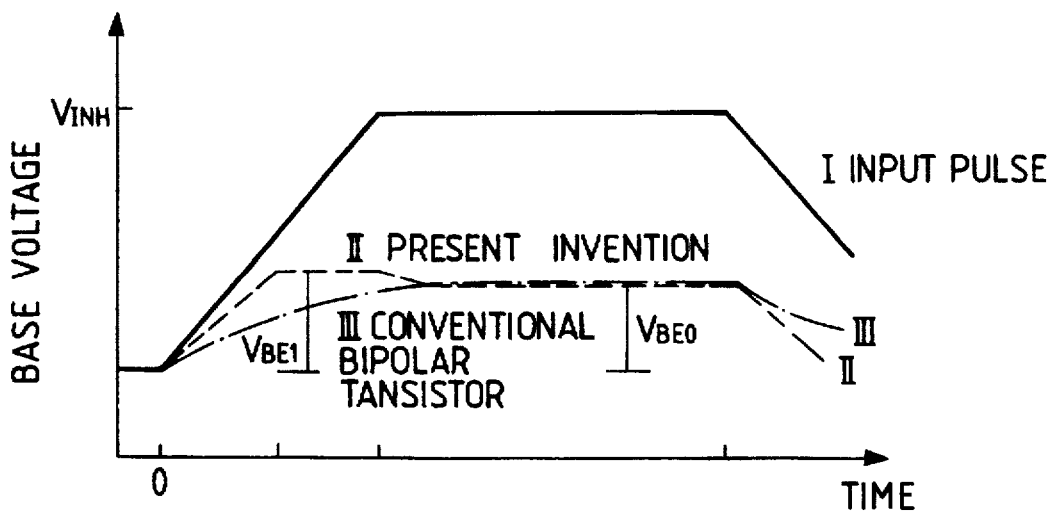
FIGS. 22A to 22D are graphs showing time-dependent changes of a base potential and a collector potential.
Figure 22B:
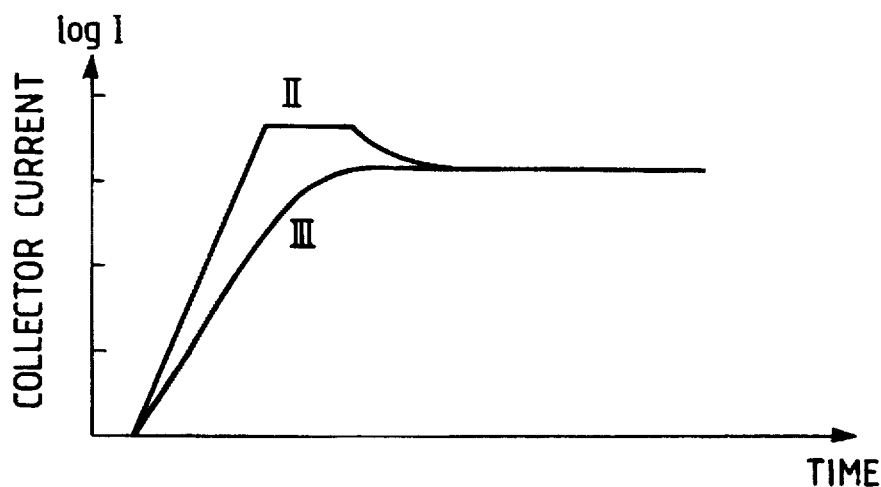

FIGS. 22A and 22B shows pulse input characteristics of the present invention and the conventional SOI lateral type bipolar transistor.

Figure 22C:
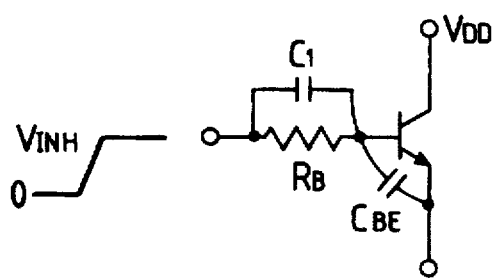
Figure 22D:
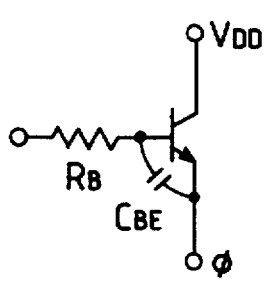

FIG. 22A shows a state of changes in an input signal (I in the graph) and base potentials of the bipolar transistor of the invention (II in the graph) and the conventional lateral type bipolar transistor (III in the graph). FIG. 22B shows a state of a collector current (II in the graph) of the bipolar transistor of the invention at that time and a collector current (III in the graph) of the conventional bipolar transistor. FIG. 22C is a simple equivalent circuit diagram of the invention and is characterized in that the capacitor $C_1$ is capacitively coupled with $C_{BE}$. FIG. 22D is a simple equivalent circuit diagram of the lateral type bipolar transistor.

In FIG. 22A, in the conventional bipolar transistor, as shown in III in the diagram, the charging operation is slowly executed until $V_{BEO}$ by the time constant which is determined by $C_{BE}$ and $R_B$. $V_{BEO}$ denotes a voltage which is applied to the base-emitter junction when a high level $V_{INH}$ of a signal voltage was applied to the base electrode. The following equation is satisfied.

$$V_{INH} = I_{BB} e \times p(qV_{BEO}/kT) \cdot (R_B + (1 + h_{FE})R_E) + V_{BEO}$$

$V_{INH}$: signal amplitude $I_{BB}$: base current when the base-emitter voltage is equal to 0

$R_E$: emitter resistance

In the above equation, consideration is made with respect to a voltage drop by the emitter resistance. However, the emitter resistance is so low as to be a few $\Omega$ and is sufficiently lower than the base resistance so that it can be ignored in the embodiment.

On the other hand, in the bipolar transistor of the invention, the base potential is determined by the capacitive division of $C_1$ and $C_{BE}$. Namely, it is given by $(C_1 \cdot V_{INH})/(C_{BE}+C_1)$ and the base potential linearly rises as shown in II in the diagram.

At a time point near $t_I$, the base voltage is set to a constant value which is slightly higher than $V_{BEO}$. After time $t_{II}$, the base voltage approaches $V_{BEO}$. At a time point near $t_I$, a voltage $V_{BE1}$ is given as follows.

$$\{(C_1 \cdot C_{BE})/(C_{BE}+C_1)\} \cdot (V_{INH}/t_{II}) + \{(V_{INH} - V_{BE1} - I_{E1} \cdot R_E)/R_B\} = I_{BB} \cdot e \times p(qV_{BE1}/kT)$$

$I_{BB}$: base current at $V_{BE}=0$ $I_{E1}$: emitter current at $V_{BE1}$ ($1=h_{FE}) \cdot I_{BB} \cdot \exp(qV_{BE1}/kT)$ The first term of the left side indicates a current which is supplied from $C_1$ to $C_{BE}$ by the capacitive division. The second term of the left side indicates a current which is supplied from the resistor $R_B$ to $C_{BE}$. The right side indicates a current which is discharged as a base current from $C_{BE}$. The voltage is settled so that the current flowing into $C_{BE}$ is equal to the current flowing out therefrom. When the resistance of $R_B$ is large, the current component of the second term can be ignored.

Although the base voltage doesn't change for a period of time between $t_I$ and $t_{II}$, the input voltage rises, so that the following current component or the like due to the capacitive division $$\{(C_1 \cdot C_{BE})/(C_{BE}+C_1)\} \cdot (V_{INH}/t_{II}) + \{(V_{INH} - V_{BE1} - I_{E1} \cdot R_E)/R_B\}$$

is supplied to the base.

Since the input voltage doesn't rise after time $t_{II}$, no current is supplied from the capacitor $C_1$ due to the capacitive division and the base voltage is settled to $V_{BEO}$.

To obtain the effect as mentioned above, the capacity $C_1$ needs to satisfy the following condition.

$$(C_1 \times V_{INH})/(C_{BE}+C_1) \geq V_{BEO}$$

That is, when the base voltage at which the voltage arrives due to the capacitive division is equal to the base voltage $V_{BEO}$ at which the voltage finally arrives, the delay which is caused until the capacity is charged to $V_{BEO}$ can be eliminated. Further, when the base voltage is larger than $V_{BEO}$, the following charges $$(C_1 \times V_{INH})/(C_{BE}+C_1) - V_{BEO}$$

can be supplied to the base faster than that in the case where they are supplied through the resistor $R_B$.

Thus, the following charges $$\{(C_1 \times V_{INH})/(C_{BE}+C_1)-V_{BEO}\} \times h_{FE}$$

can be supplied to the collector.

Therefore, more preferably, the value of $C_1$ is determined so that the charge amount $Q_{CC}=C_{LOAD} \times V_{OUT}$ to be charged into the collector satisfies the following relation.

$$Q_{CC} \leq \{(C_1 \times V_{INH})/(C_{BE}+C_1)-V_{BEO}\} \times h_{FE}$$

By deciding $C_1$ as mentioned above, at a time point when the input signal is set to the high level, the charging operation into the capacitive load has been finished, so that an extremely high-speed buffer can be realized.

$C_{LOAD}$ denotes a capacitor added to the collector and $V_{OUT}$ indicates a necessary output voltage.

Now, assuming that a base concentration is equal to $2 \times 10^{17}$ cm$^{-3}$, a thickness of SOI film is equal to 0.5 µm, a base length L is equal to 0.5 µm, and a width W is equal to 5 µm, $C_{BE}$=3.3 fF. In this instance, at the power source voltage of 5 V, $V_{BEO}$ is equal to about 1 V.

Therefore, it is necessary to set such that $C_1 \geq 0.83$ fF.

Figure 23:
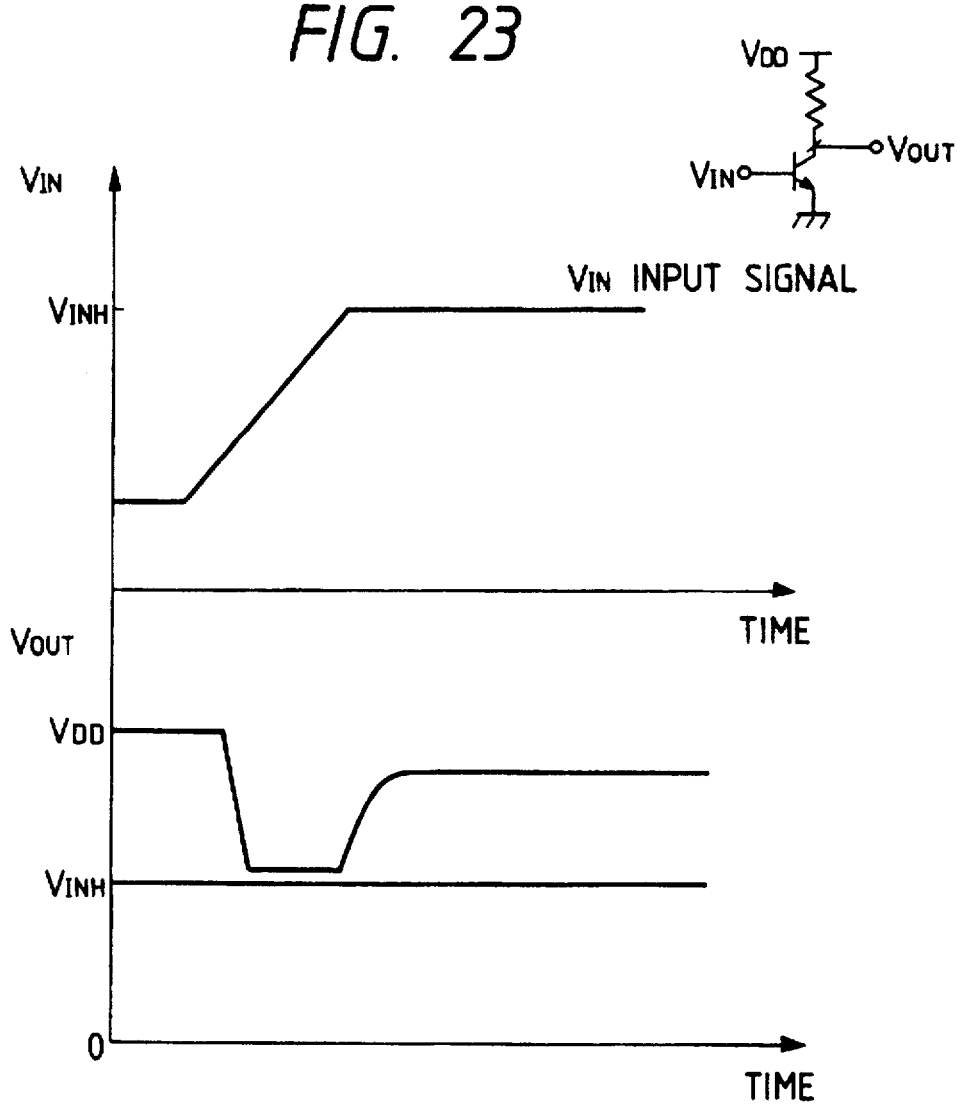
FIG. 23 is a graph showing pulse characteristics of the embodiment 7.

In the embodiment, an npn type lateral type bipolar transistor is manufactured. An oxide film thickness is set to 10 nm. An oxide film capacity is set to 8.6 fF. Those values satisfy the above condition, so that pulse characteristics shown in FIG. 23 are obtained. According to FIG. 23, it will be understood that a large amount of current flows at a leading time of the input signal. It is indicated that the device of the invention is an effective device as a high-speed buffer. A current amplification factor is equal to about 100. A high frequency cut-off frequency is equal to about 10 GHz. A base short emitter-collector withstanding voltage is equal to about 20 V. Preferable characteristics are obtained.

Although a depletion layer is extended in the oxide film interface in dependence on the gate material or the state of oxide film interface, in this case, $C_1$ is considered as a serial coupling of the oxide film capacitor and the depletion layer capacitor.

The invention is not limited to only the above embodiments. Since the thickness of SOI silicon layer, the impurity concentration of the well (channel) of the MOS transistor, the base impurity concentration of the bipolar transistor, and the length of gate polysilicon become main factors to determine the characteristics of the MOS transistor and bipolar transistor, it is sufficient to decide those values so as to obtain desired transistor characteristics. Specifically speaking, the thickness of SOI silicon layer is set to 3 µm or less, preferably, 1 µm or less and, more desirably, 300 nm or less. The impurity concentrations of the well of the MOS transistor and the base of the bipolar transistor are set to a value which is equal to or less than $1 \times 10^{19}$ cm$^{-3}$ and is equal to or larger than $1 \times 10^{16}$ cm and, preferably, which is equal to or less than $5 \times 10^{18}$ cm$^{-3}$ and is equal to or larger than $1 \times 10^{17}$ cm$^{-3}$. The length of gate polysilicon is set to 1 µm or less, preferably, 10 µm or less and, more desirably, 1 µm or less.

Figure 24:
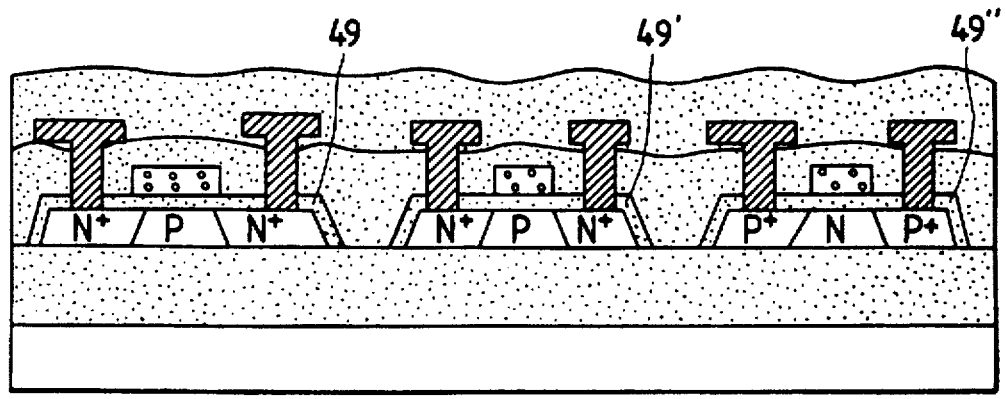
FIG. 24 is a schematic cross sectional view showing a modification of the embodiment 7.

Although the element isolation has been performed by the selective oxidation in the embodiment, it is also possible to execute the element isolation by patterning the SOI silicon layer as shown by reference numerals 49, 49', and 49" in FIG. 24.

Although the embodiment has been shown and described with respect to the example in which the collectors, emitters, sources, and drains of the adjacent transistors are formed as different diffusion regions, parts of the collectors, emitters, sources, and drains of the adjacent bipolar transistors can be also formed by the same diffusion layer. In this case, an integration degree can be further raised.

(Embodiment 8)

The embodiment 8 of the invention will now be described with reference to FIGS. 25A and 25B.

Figure 25A:
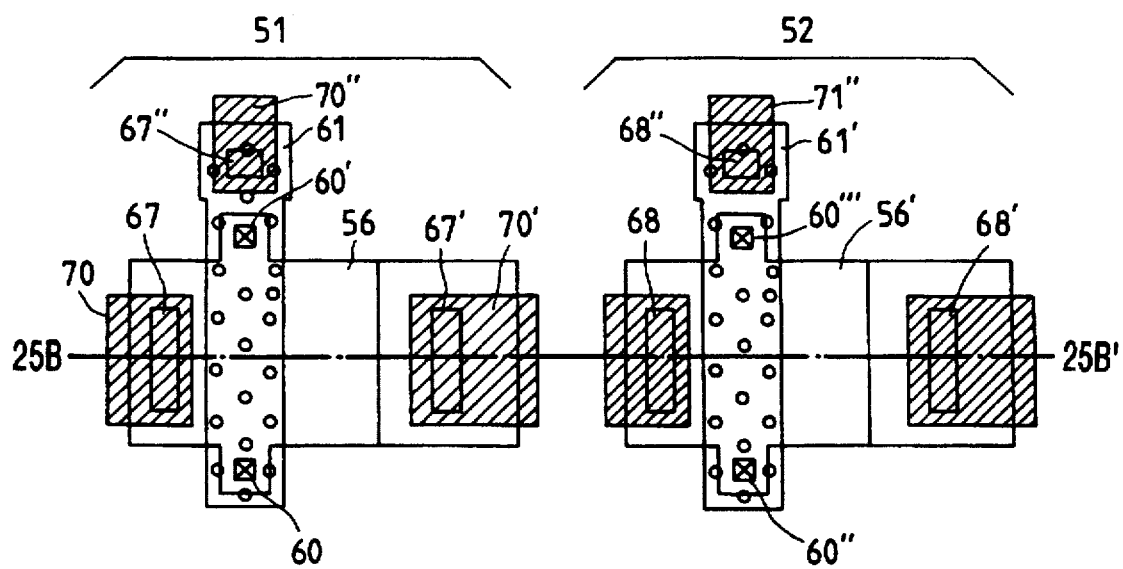
FIGS. 25A and 25B are schematic diagrams showing the embodiment 8 of the invention.

FIG. 25A is a plan view showing a structure of the embodiment 8. FIG. 25B is a cross sectional structural diagram taken along the line 25B-25B' in FIG. 25A.

Figure 25B:
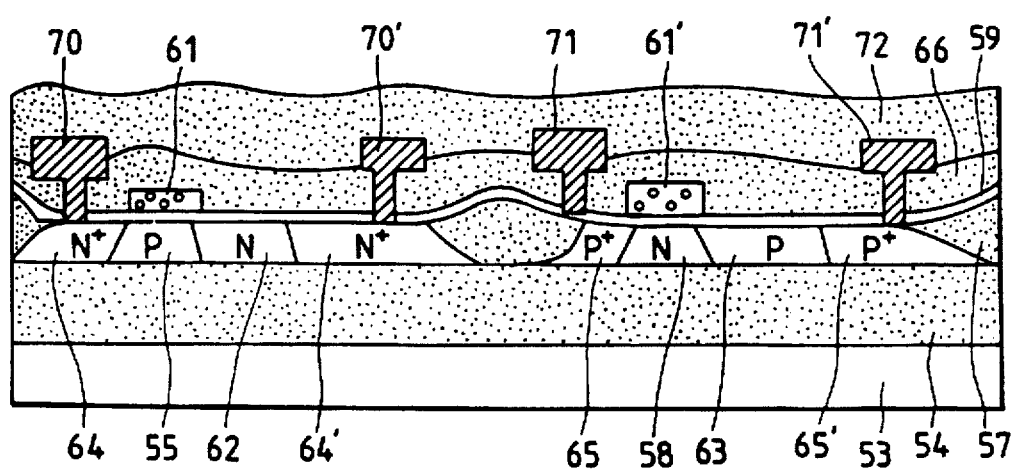

In FIGS. 25A and 25B, reference numeral 51 denotes an npn-type bipolar transistor; 52 a pnp-type bipolar transistor; 53 a silicon substrate; 54 an insulative film; 55 a silicon layer which was formed onto the insulative film and constructed as a p type after that; 56 a selective oxide (LOCOS) layer edge; 57 a selective oxide layer; 58 an n well region; 59 a gate oxide film; 60, 60', 60", and 60'" base contacts; 61 a p-type polysilicon layer into which boron was doped; 61' an n-type polysilicon layer into which phosphorus was doped; 62 an n-type diffusion region formed by implanting phosphorus ions; 63 a p-type diffusion region formed by implanting boron ions; 64 and 64' n$^+$-type diffusion regions formed by implanting arsenic ions; 65 and 65' p$^+$-type diffusion regions formed by implanting boron ions; 66 an inter-layer insulative film; 67, 67', 67", 68, 68', and 68" contacts; 70 an Al layer serving as an emitter electrode; 70' an Al layer serving as a collector electrode; 70" an Al layer serving as a base electrode; 71 an Al layer serving as an emitter electrode; 71' an Al layer serving as a collector electrode; 71" an Al layer serving as a base electrode; and 72 a passivation film.

In the embodiment as well, an NMOS transistor and a PMOS transistor are formed in a manner similar to the embodiment 7.

The embodiment 8 is realized by adding ion implantation processes to form the n-type diffusion region 62 and p-type diffusion region 63 to the processing flow (FIG. 18) of the embodiment 7.

The n-type diffusion region 62 and the p-type diffusion region 63 of the embodiment respectively function as collector regions of the npn bipolar transistor 51 and pnp bipolar transistor 52. By providing the collector regions of low concentrations, the emitter-collector withstanding voltage is further improved.

By the embodiment 8, there is formed a lateral type npn bipolar transistor in which a thickness of SOI silicon is equal to 200 nm, a p well surface concentration is equal to $2 \times 10^{17}$ cm$^{-3}$, a gate polysilicon length is equal to 0.6 µm, and an n-type diffusion layer width is equal to 1 µm. Thus, a current amplification factor is equal to about 100, a high frequency cut-off frequency is equal to about 8 GHz, and a base short emitter-collector withstanding voltage is equal to about 40 V. Preferable characteristics are obtained.

In the embodiment, the n-type diffusion layer 62 and the n$^+$-type diffusion layer 64' have been formed by different masks and the p-type diffusion layer 63 and the p$^+$-type diffusion layer 65' have been formed by different masks, respectively. However, such a structure can be also formed by another method and an effect similar to that of the embodiment can be derived so long as a low concentration layer can be formed on the collector side. For example, what is called an LDD structure, a DDD structure, or the like can be mentioned as such an example.

(Embodiment 9)

The embodiment 9 of the invention will now be described with reference to FIGS. 26A and 26B.

Figure 26A:
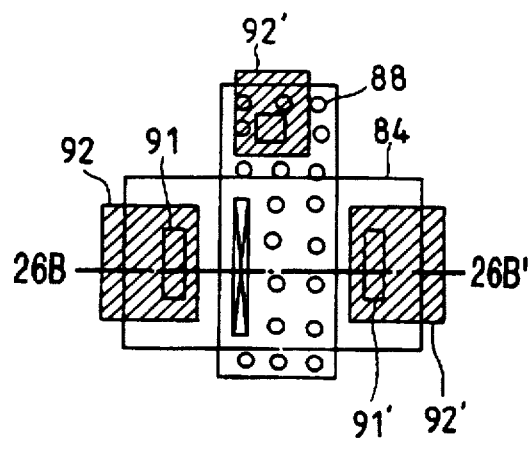
FIGS. 26A and 26B are schematic plan views showing the embodiment 9.

FIG. 26A is a plan view showing a structure of the embodiment. FIG. 26B is a cross sectional structural view taken along the line 26B-26B' in FIG. 26A.

Figure 26B:
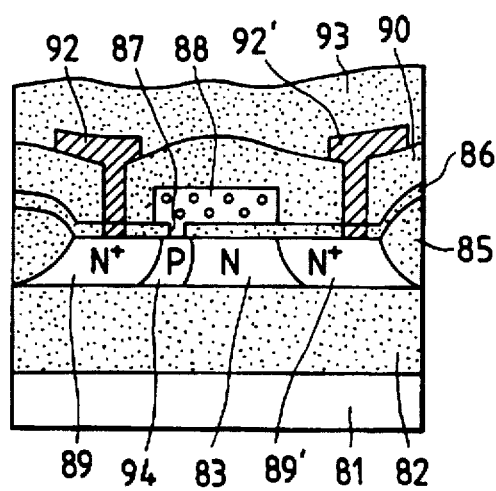

FIGS. 26A and 26B show an npn-type bipolar transistor. Reference numeral 81 denotes a silicon substrate; 82 an insulative film; 83 an n-type silicon layer formed on the insulative film; 84 a selective oxide (LOCOS) layer edge; 85 a selective oxide layer; 86 a gate oxide film; 87 a base contact; 88 a p-type polysilicon layer into which boron was doped; 89 and 89' n$^+$-type diffusion regions formed by implanting arsenic ions; 90 an inter-layer insulative film; 91 and 91' contacts; 92 an Al layer serving as an emitter electrode; 92' an Al layer serving as a collector electrode; 92" an Al layer serving as a base electrode; and 93 a passivation film.

In the embodiment 9, a pnp-type bipolar transistor, an NMOS transistor, and a PMOS transistor can be also manufactured in a manner similar to the embodiment 7.

In the embodiment 9, a base region 94 is formed by a thermal diffusion of boron in polysilicon 88. Since a base contact is formed just on almost of the base region, a bipolar transistor of a further small base parasitic resistance can be formed.

By the embodiment, there is formed a lateral type npn bipolar transistor in which an SOI silicon thickness is equal to 200 nm, a base contact width is equal to 0.3 μm, a p base surface concentration is equal to $2 \times 10^{17}$ cm$^{-3}$, a gate polysilicon length is equal to 0.8 μm, and an n-type diffusion layer width is equal to 1 μm. Thus, a current amplification factor is equal to about 100, a high frequency cut-off frequency is equal to about 10 GHz, and a base short emitter-collector withstanding voltage is equal to about 40 V. Preferable characteristics are obtained.

Figure 27A:
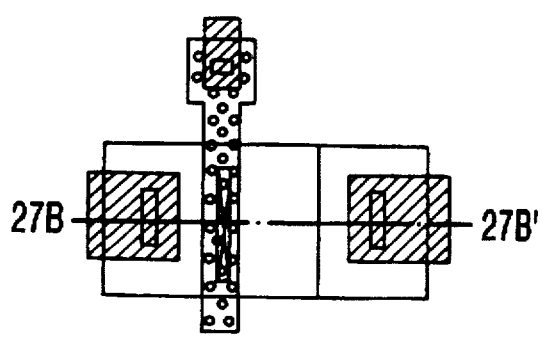
FIGS. 27A and 27B are schematic diagrams showing a modification of the embodiment 9.
Figure 27B:
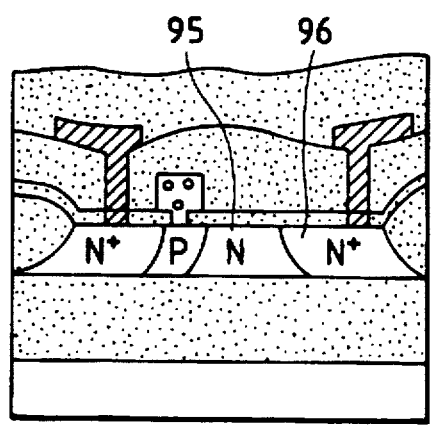

Although the embodiment has been shown and described with respect to the case where the n-type collector region exists under the polysilicon layer, the n-type collector region is not necessarily provided under the polysilicon layer. FIGS. 27A and 27B show an example in which the device was manufactured by a process similar to the embodiment 8. In this example, an n-type diffusion layer 95 and an n$^+$-type diffusion layer 96 are respectively formed by using different masks. Such a structure can be also formed by another method. An effect similar to that in the embodiment 9 is obtained so long as a low concentration layer can be formed on the collector side. For example, what is called an LDD structure, a DDD structure, or the like can be mentioned as a such a structure.

(Embodiment 10)

The embodiment 10 of the invention will now be described with reference to FIGS. 28A to 28D.

Figure 28A:
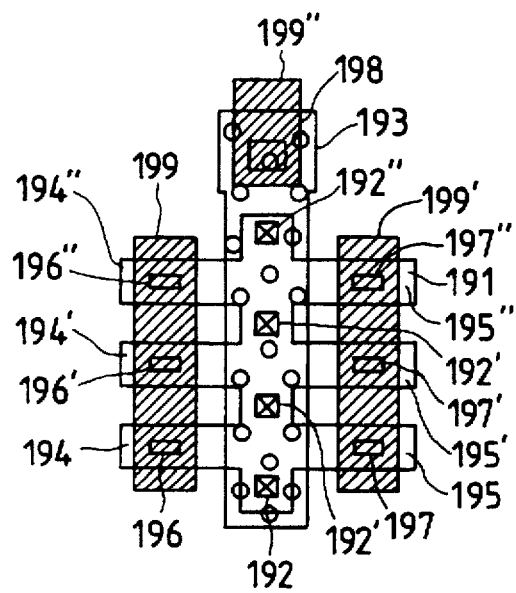
FIGS. 28A to 28D are schematic diagrams showing the embodiment 10 of the invention.
Figure 28B:
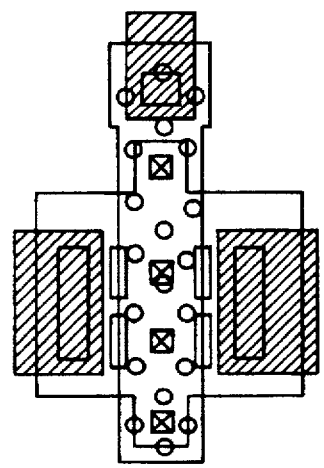

FIG. 28A is a plan view showing a structure of the embodiment 10. FIG. 28B shows an npn-type bipolar transistor. Reference numeral 191 denotes a selective oxide (LOCOS) layer edge; 192, 192', 192", and 192'" indicate base contacts; 193 a p-type polysilicon layer into which boron was doped; 194, 194', and 194" n$^+$-type diffusion regions serving as emitters and formed by implanting arsenic ions; 195, 195', and 195" n$^+$-type diffusion regions serving as collectors and formed by implanting arsenic ions; 196, 196', 196", 197, 197', 197", and 198 contacts; 199 an Al layer serving as an emitter electrode; 199' an Al layer serving as a collector electrode; and 199" an Al layer serving as a base electrode.

In the embodiment 10, a pnp-type bipolar transistor, an NMOS transistor, and a PMOS transistor are also manufactured in a manner similar to the embodiment 7.

In the embodiment 10, by connecting in parallel a plurality of bipolar transistors each having a narrow emitter width, a clouding effect is prevented.

By the embodiment 10, there is manufactured a bipolar transistor by connecting in parallel ten lateral type npn bipolar transistors in each of which an SOI silicon thickness is equal to 200 nm, a p base surface concentration is equal to $2 \times 10^{17}$ cm$^{-3}$, a gate polysilicon length is equal to 0.8 μm, and an emitter width is equal to 1 μm. Thus, a current amplification factor is equal to about 100, a high frequency cut-off frequency is equal to about 15 GHz, and a base short emitter-collector withstanding voltage is equal to about 20 V. Preferable characteristics are derived.

Figure 28C:
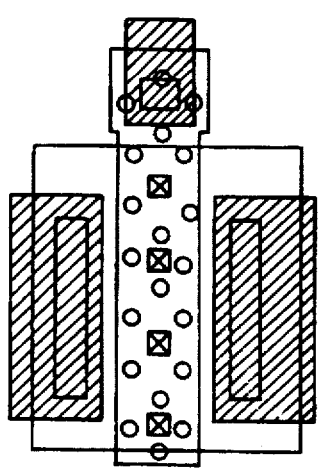
Figure 28D:
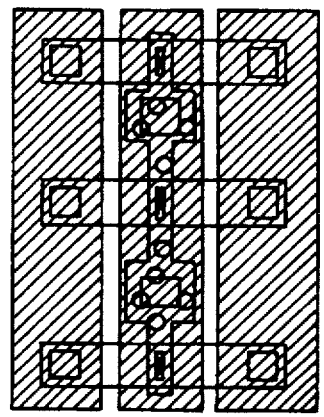

Although the embodiment 10 has been shown and described with respect to the case where the selective oxide layer edges are isolated in the emitter and collector regions and are communicated with each other in the base region, a device doesn't depart from the spirit of the embodiment so long as a plurality of bipolar transistors each having a narrow emitter width are connected in parallel. For example, an effect similar to that of the embodiment 10 can be also derived even in case of a device as shown in FIG. 28B such that the emitter and collector regions are connected and the base contact peripheries are isolated, a device as shown in FIG. 28C such that the base contact peripheries are not isolated, or a device as shown in FIG. 28D such that the base region is formed as in the embodiment 9 and polysilicon is electrically connected in parallel with the aluminum layer in order to further reduce the base resistance.

(Embodiment 11)

The embodiment 11 of the invention will now be described with reference to FIGS. 29A and 29B.

Figure 29A:
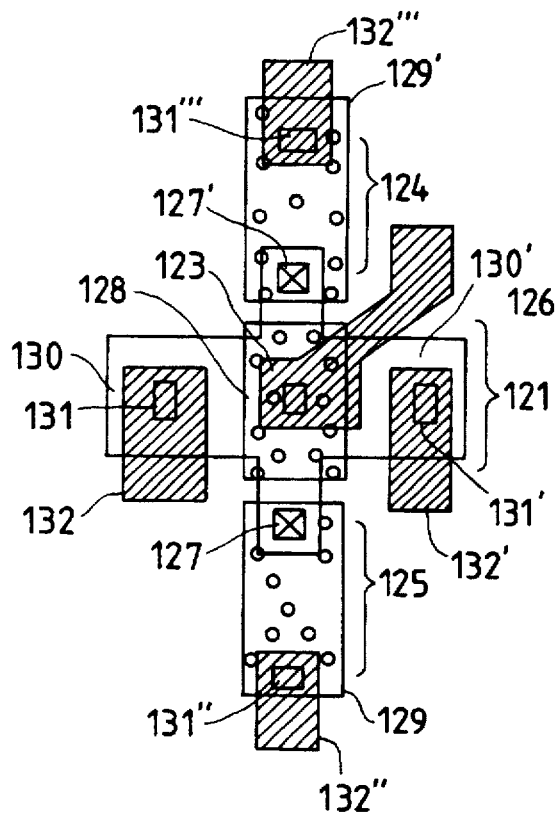
FIGS. 29A and 29B are a schematic diagram and its equivalent circuit diagram showing the embodiment 11.
Figure 29B:
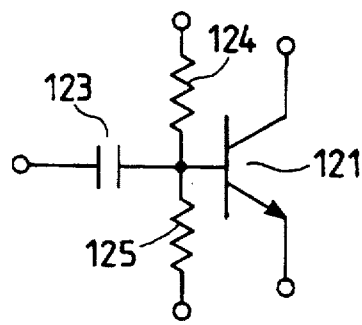

FIG. 29A is a plan view showing a structure of the embodiment. FIG. 29B is an equivalent circuit diagram of FIG. 29A.

In the drawings, reference numeral 121 denotes an npn-type bipolar transistor; 123 an MIS type capacitor; 124 and 125 polysilicon resistors; 126 a selective oxide (LOCOS) layer edge; 127, 127' base contacts; 128 a p-type polysilicon layer into which boron was doped; 129 and 129' n-type polysilicon layers serving as resistors; 130 an n$^+$-type diffusion region serving as an emitter and formed by implanting arsenic ions; 130' an n$^+$-type diffusion region serving as a collector and formed by implanting arsenic ions; 131, 131', 131", 131'" contacts; 132 an Al layer serving as an emitter electrode; 132' an Al layer serving as a collector electrode; and 132" and 132'" Al layers which are connected to the base through the resistor.

In the embodiment 11, a pnp-type bipolar transistor, an NMOS transistor, and a PMOS transistor are also manufactured in a manner similar to the embodiment 7.

According to the embodiment, by merely changing a method of forming the base contact in each of the foregoing embodiments, a capacitor and a resistor can be easily formed and a bipolar amplifier can be formed.

(Embodiment 12)

The embodiment 12 of the invention will now be described with reference to FIG. 30.

Figure 30:
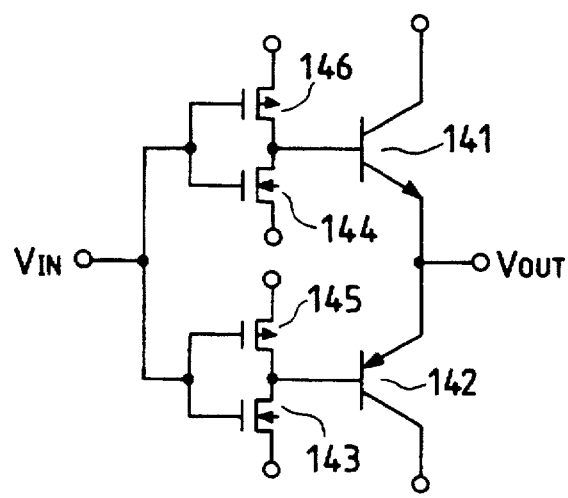
FIG. 30 is a circuit diagram showing an equivalent circuit of the embodiment 12 of the invention.

FIG. 30 shows an example in which a Bi-CMOS circuit was formed by using the bipolar transistor and MOS transistor described so far.

In FIG. 30, reference numeral 141 denotes an npn-type bipolar transistor; 142 a pnp-type bipolar transistor, 143 and 144 n-type MOS transistors; and 145 and 146 p-type MOS transistors. A fundamental logic gate circuit is formed.

According to the invention, such a Bi-CMOS can be easily formed by merely adding a base patterning step and ion implanting steps of p-type and n-type impurities into the polysilicon layer as compared with the conventional standard CMOS process.

(Embodiment 13)

The embodiment 13 of the invention will now be described with reference to FIGS. 31A and 31B.

Figure 31A:
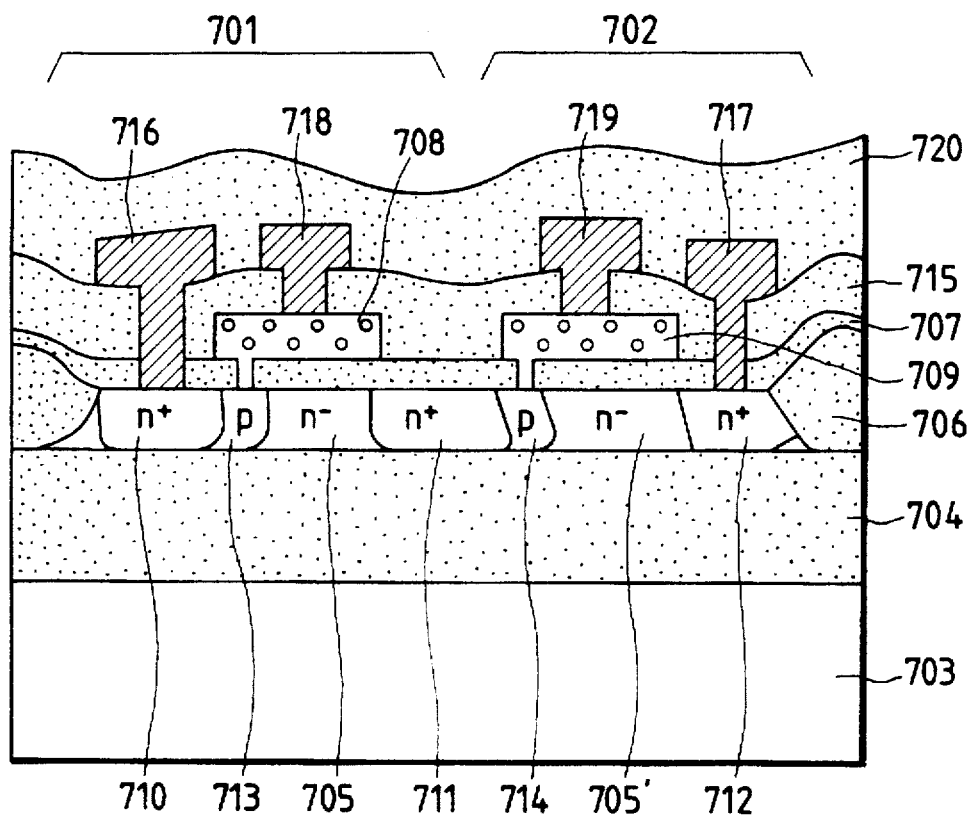
FIGS. 31A and 31B are a schematic cross sectional view and its equivalent circuit showing the embodiment 13 of the invention.
Figure 31B:
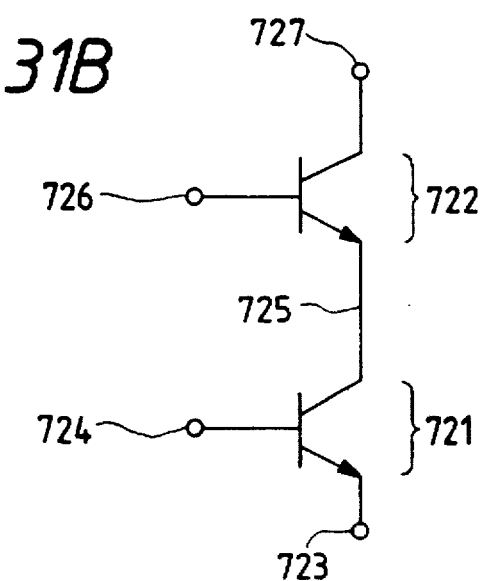

FIG. 31A is a cross sectional view showing a structure of the embodiment and FIG. 31B is an equivalent circuit diagram of the embodiment.

In FIG. 31A, reference numeral 701 denotes a first npn-type bipolar transistor; 702 a second npn-type bipolar transistor; 703 a silicon substrate; 704 an insulative film; 705 and 705' n⁻-type silicon layers formed on the insulative film 704; 706 a selective oxide layer; 707 a gate oxide film; 708 a p-type polysilicon layer serving as a base electrode of the first bipolar transistor 701; 709 a p-type polysilicon layer serving as a base electrode of the second bipolar transistor 702; 710 an n⁺ region serving as an emitter of the first bipolar transistor 701; 711 an n⁺ region serving as a collector of the first bipolar transistor 701 and an emitter of the second bipolar transistor 702; 712 an n⁺ region serving as a collector of the second bipolar transistor 702; 713 a p region serving as a base of the first bipolar transistor 701; 714 a p region serving as a base of the second bipolar transistor 702; 715 an inter-layer insulative film; 716 an emitter electrode of the first bipolar transistor 701; 717 a collector electrode of the second bipolar transistor 702; 718 a base electrode of the first bipolar transistor 701; 719 a base electrode of the second bipolar transistor 702; and 720 a passivation film.

In FIG. 31B, reference numeral 721 denotes the first bipolar transistor 701; 722 the second bipolar transistor 702; 723 an emitter electrode of the first bipolar transistor; 724 a base electrode of the first bipolar transistor 725; a collector electrode of the first bipolar transistor and an emitter electrode of the second bipolar transistor; 726 a base electrode of the second bipolar transistor; and 727 a collector electrode of the second bipolar transistor.

A substrate structure in which the silicon layer is formed on the insulative film can be realized by an SIMOX technique, a laser recrystalline technique, a wafer joining technique, or the like.

In the embodiment, since the n⁺ layer 711 on the insulative film functions as both of the collector region of the first bipolar transistor 701 and the emitter region of the second bipolar transistor 702, when the collector and emitter of the adjacent bipolar transistors are connected, there is no need to perform the element isolation and to provide wirings. A bipolar transistor semiconductor device of a high integration degree, a low resistance, and a low capacity can be realized.

Although the embodiment has been shown and described with respect to the example in which the collector and emitter of the adjacent npn-type bipolar transistors have been formed by the same diffusion layer, a similar effect can be also obtained by applying the invention to the formation of the source and drain of the adjacent n-type MOS transistors or to the formation of the collector or emitter of the adjacent npn-type bipolar transistors and the source or drain of the n-type MOS.

(Embodiment 14)

The embodiment 14 of the invention will now be described with reference to FIGS. 32a and 32B.

Figure 32A:
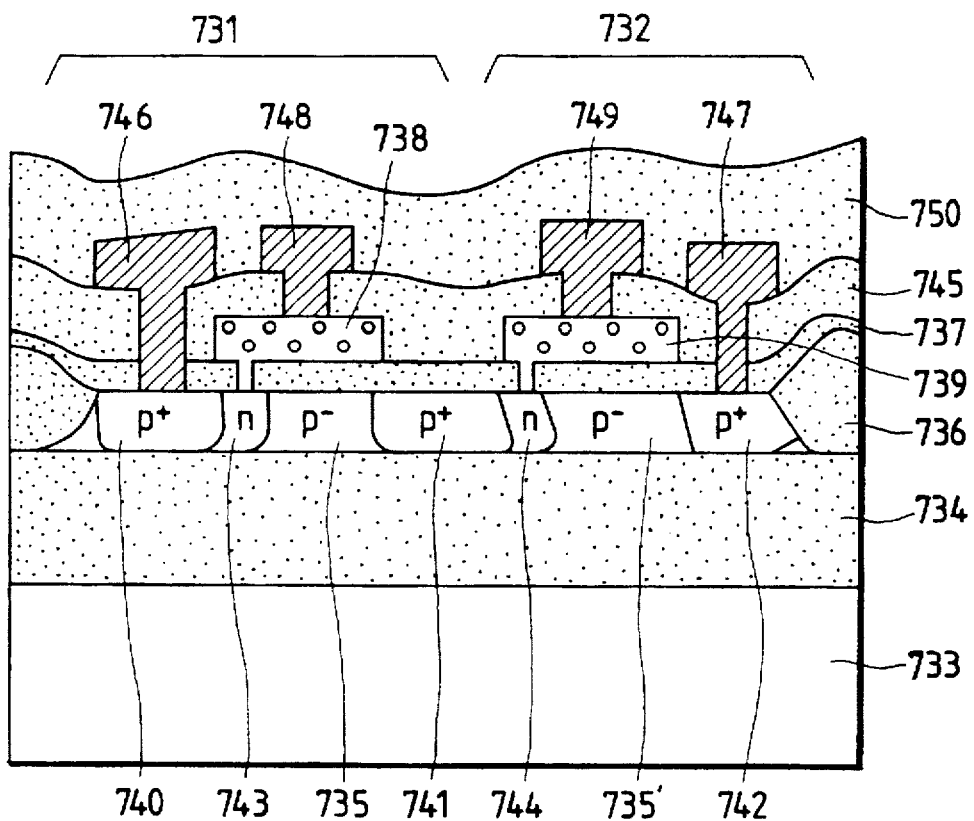
FIGS. 32A and 32B are diagrams showing a schematic cross sectional view and its equivalent circuit showing the embodiment 14 of the invention.

FIG. 32A is a cross sectional view showing a structure of the embodiment. FIG. 32B is an equivalent circuit diagram of the embodiment.

In FIG. 32A, reference numeral 731 denotes a first pnp-type bipolar transistor; 732 a second pnp-type bipolar transistor; 733 a silicon substrate; 734 an insulative film; 735 and 735' p⁻-type silicon layers formed on the insulative film 734; 736 a selective oxide layer; 737 a gate oxide film; 738 an n-type polysilicon layer serving as a base electrode of the first bipolar transistor 731; 739 an n-type polysilicon layer serving as a base electrode of the second bipolar transistor 732; 740 a p⁺ region serving as an emitter of the first bipolar transistor 731; 741 a p⁺ region serving as a collector of the first bipolar transistor 731 and an emitter of the second bipolar transistor 732; 742 a p⁺ region serving as a collector of the second bipolar transistor 732; 743 an n region serving as a base of the first bipolar transistor 731; 744 an n region serving as a base of the second bipolar transistor 732; 745 an interlayer insulative film; 746 an emitter electrode of the first bipolar transistor 731; 747 a collector electrode of the second bipolar transistor 732; 748 a base electrode of the first bipolar transistor 731; 749 a base electrode of the second bipolar transistor 732; and 750 a passivation film.

Figure 32B:
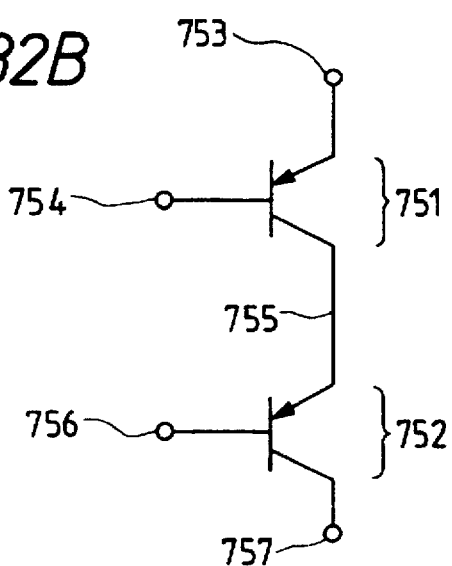

In FIG. 32B, reference numeral 751 the first pnp-type bipolar transistor 731; 752 the second bipolar transistor 732; 753 an emitter electrode of the first bipolar transistor; 754 a base electrode of the first bipolar transistor; 755 a collector electrode of the first bipolar transistor and an emitter electrode of the second bipolar transistor; 756 a base electrode of the second bipolar transistor; 757 a collector electrode of the second bipolar transistor.

In the embodiment, since the p⁺ layer 741 on the insulative film functions both of the collector region of the first bipolar transistor 731 and the emitter region of the second bipolar transistor 732, when the collector and emitter of the adjacent bipolar transistors are connected, there is no need to perform the element isolation and to provide wirings in a manner similar to the embodiment 13. A bipolar transistor semiconductor device of a high integration degree, a low resistance, and a low capacitor can be realized.

Although the embodiment has been shown and described with respect to the example in which the collector and emitter of the adjacent pnp-type bipolar transistors have been formed by the same diffusion layer, a similar effect can be also accomplished even by applying the invention to the formation of a source and a drain of the adjacent p-type MOS or the formation of the collector or emitter of the adjacent pnp type bipolar transistors and the source or drain of the p-type MOS.

(Embodiment 15)

The embodiment 15 of the invention will now be described with reference to FIGS. 33A and 33B.

Figure 33A:
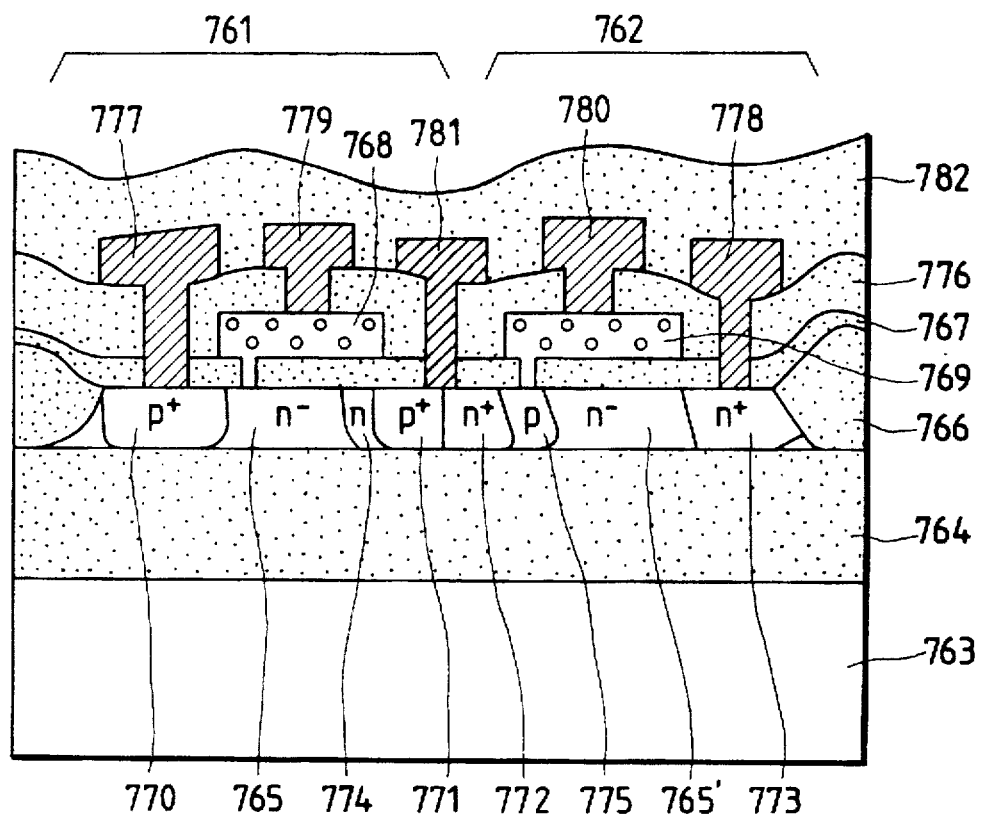
FIGS. 33A and 33B are diagrams showing a cross sectional structural diagram and its equivalent circuit of the embodiment 15.

FIG. 33A is a cross sectional view showing a structure of the embodiment. FIG. 33B is an equivalent circuit diagram of the embodiment.

In FIG. 33A, reference numeral 761 denotes a pnp-type bipolar transistor; 762 an npn-type bipolar transistor; 763 a silicon substrate; 764 an insulative film; 765 and 765' n⁻-type silicon layers formed on the insulative film 764; 766 a selective oxide layer; 767 a gate oxide film; 768 an n-type polysilicon layer serving as a base electrode of the bipolar transistor 761; 769 a p-type polysilicon layer serving as a base electrode of the bipolar transistor 762; 770 a p⁺ region serving as a collector of the bipolar transistor 761; 771 a p⁺ region serving as an emitter of the bipolar transistor 761; 772 an n⁺ region serving as an emitter of the bipolar transistor 762, 773 an n⁺ region serving as a collector of the bipolar transistor 762; 774 an n region serving as a base of the bipolar transistor 762; 774 an n region serving as a base of the bipolar transistor 761; 775 a p region serving as a base of the bipolar transistor 762; 776 an inter-layer insulative film; 777 a collector electrode of the bipolar transistor 761; 778 a collector electrode of the bipolar transistor 762; 779 a base electrode of the bipolar transistor 761; 780 a base electrode of a bipolar transistor 762; 781 an emitter electrode of the bipolar transistor 761 and an emitter electrode of the bipolar transistor 762; and 782 a passivation film.

Figure 33B:
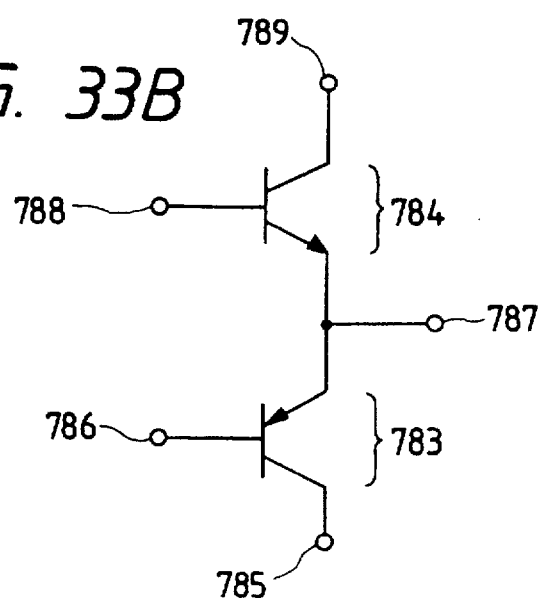

In FIG. 33B, reference numeral 783 denotes the pnp-type bipolar transistor 761; 784 the npn-type bipolar transistor 762; 785 an emitter electrode of the bipolar transistor 783; 786 a base electrode of the bipolar transistor 783; 787 a collector electrode of the bipolar transistor 783 and an emitter electrode of the bipolar transistor 784; 788 a base electrode of the bipolar transistor 784; and 789 a collector electrode of the bipolar transistor 784.

In the embodiment, the p⁺ layer 71 and n⁺ layer 72 on the insulative film are electrically connected by one electrode 781 and function as both of the emitter region of the pnp-type bipolar transistor 761 and the emitter region of the npn-type bipolar transistor 762. Therefore, when the emitter and emitter of the adjacent bipolar transistors are connected, there is no need to perform the element isolation and to provide long wirings. A bipolar transistor semiconductor device of a high integration degree, a low resistance, and a low capacity can be realized.

Although the embodiment has been shown and described with respect to the example in which the emitter of the npn-type bipolar transistor and the emitter of the pnp-type bipolar transistor which are neighboring have been formed by the same diffusion layer, a similar effect can be also obtained even by applying the invention to the formation of the source or drain of the n-type MOS and the source or drain of the p-type MOS which are neighboring, the formation of the collector or emitter of the npn-type bipolar transistor and the source or drain of the p-type MOS which are neighboring, or the formation of the collector or emitter of the pnp-type bipolar transistor and the source or drain of the n-type MOS which are neighboring.

(Embodiment 16)

The embodiment 16 of the invention will now be described with reference to FIG. 34.

Figure 34:
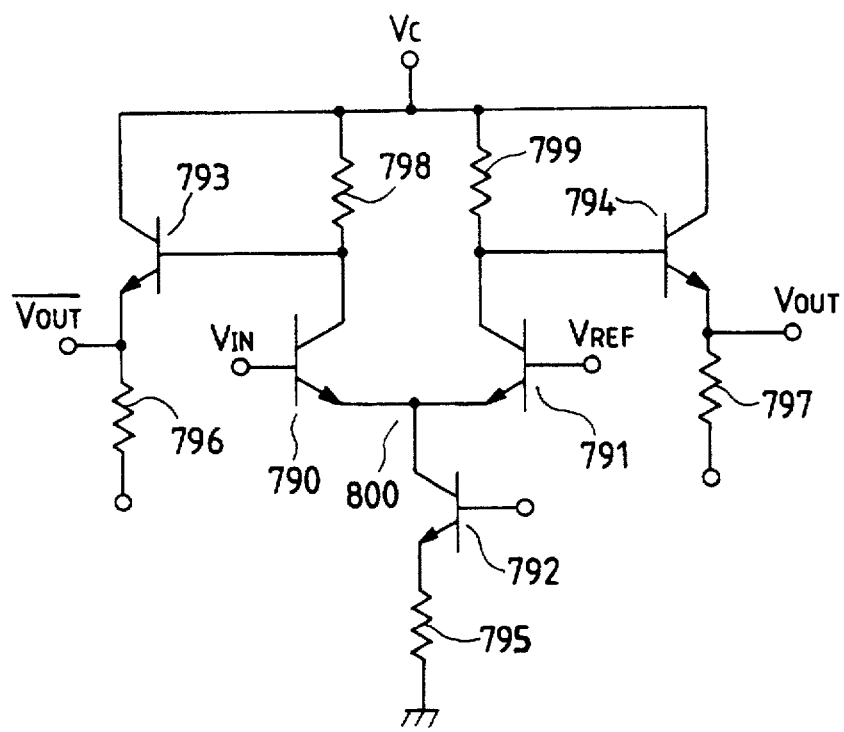
FIG. 34 is a circuit diagram showing the embodiment 16 of the invention.

FIG. 34 shows an example of an emitter coupled logic circuit comprising: npn-type bipolar transistors 790, 791, 792, 793, and 794; and resistors 795, 796, 797, 798, and 799. All of the elements constructing the circuit are formed in a silicon layer on the insulative film. A terminal 800 is formed by the same n⁺ region in a manner similar to the embodiment 13 and functions as emitter regions of the bipolar transistors 790 and 791 and a collector region of the bipolar transistor 792. According to the embodiment, the chip size can be reduced by about 30% and the operating speed can be raised by about 40% than those of the conventional bulk type circuit example.

(Embodiment 17)

The embodiment 17 of the invention will now be described with reference to FIG. 35.

Figure 35:
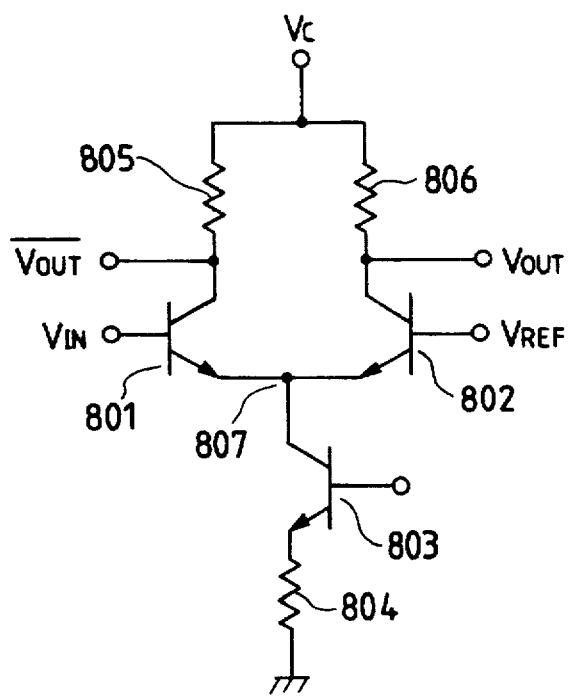
FIG. 35 is a circuit diagram showing the embodiment 17 of the invention.

FIG. 35 shows an example of a current mode logic circuit comprising: npn-type bipolar transistors 801, 802, and 803; and resistors 804, 805, and 806. All of the elements constructing the circuit are formed in a silicon layer on the insulative film. A terminal 807 is formed by the same n⁺ region in a manner similar to the embodiment 13 and functions as emitter regions of the bipolar transistors 801 and 802 and a collector region of the bipolar transistor 803.

According to the embodiment, the chip size can be reduced by about 30% and the operating speed can be reduced by about 40% than those of the conventional bulk type circuit example.

(Embodiment 18)

The embodiment 18 of the invention will now be described with reference to FIG. 36.

Figure 36:
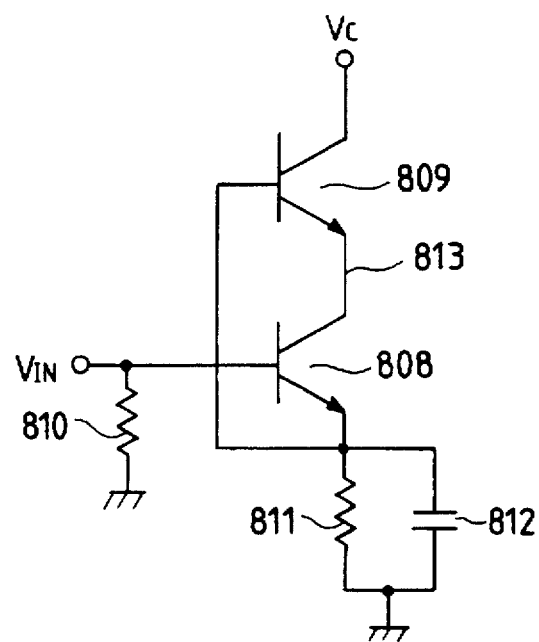
FIG. 36 is a circuit diagram showing the embodiment 18 of the invention.

FIG. 36 shows an example of a high-speed amplifying circuit comprising: npn-type bipolar transistors 808 and 809; resistors 810 and 811; and a capacitor 812. All of the elements constructing the circuit are formed in a silicon layer of the insulative film. A terminal 813 is formed by the same n⁺ region in a manner similar to the embodiment 13 and functions as an emitter region of the bipolar transistor 809 and a collector region of the bipolar transistor 808.

According to the embodiment, the chip size can be reduced by about 20% and the operating speed can be reduced by about 15% than those of the conventional bulk type circuit example.

(Embodiment 19)

The embodiment 19 of the invention will now be described with reference to FIG. 37.

Figure 37:
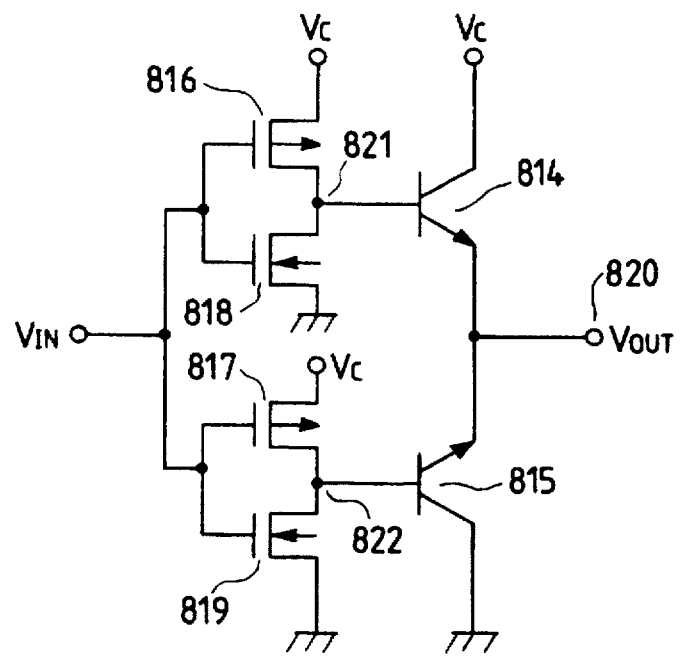
FIG. 37 is a circuit diagram showing the embodiment 19 of the invention.

FIG. 37 shows an example of a Bi-CMOS circuit comprising: npn-type bipolar transistors 814 and 815; p-type MOS 816 and 817; and n-type MOS 818 and 819. All of the elements constructing the circuit are formed in a silicon layer on the insulative film. A terminal 820 is formed by an n⁺ region and a p⁺ region which are electrically connected by the same electrode in a manner similar to the embodiment 15 and functions as an emitter region of the bipolar transistor 814 and an emitter region of the bipolar transistor 815. Terminals 821 and 822 are formed by an n⁺ region and a p⁺ region which are electrically connected by the same electrode in a manner similar to the embodiment 15 and function as a source region and a drain region of the MOS transistor.

A ring oscillator, a shift register, or the like is constructed by the embodiment. Thus, the chip size can be reduced by about 40% and the operating speed can be raised by about 50% than those of the conventional bulk type circuit example.

According to the invention as described above, the gate electrode is connected to a part of the channel region and the channel region has the same conductivity type as that of the source and drain regions and has an impurity concentration lower than that of the source and drain regions. Thus, the carrier is run due to the drift instead of the diffusion. A semiconductor device having excellent response characteristics can be provided.

By coming into contact with the gate and the channel, the minority carrier is implanted and a large current driving can be performed. The parasitic capacity is reduced and a high frequency response can be realized.

Further, the number of processing steps which are common to those in the MOS process is large and many common component elements can be easily integrated together with the MOS transistor.

In addition, according to the invention, a Bi-CMOS semiconductor device can be formed by a simple process such as to merely add the base contacting step and the gate ion implanting step to the standard CMOS process. A lateral type bipolar transistor in which an integration degree is high, a power source voltage on the collector side is high, a current amplification factor is high, and a high frequency cut-off frequency is high can be realized.

According to the invention, further, when the collectors or emitters of the adjacent bipolar transistors are connected, there is no need to perform the element isolation and to provide wirings. A bipolar transistor semiconductor device of a high integration degree and a high speed can be realized.

What is claimed is:

1. A semiconductor device comprising, on a substrate the surface of which has at least an insulating property:

a lateral type bipolar transistor having a semiconductor region comprising collector, base and emitter regions; and a MOS transistor having a semiconductor region including a region operating as a channel region, an insulating film provided on said semiconductor region and a gate electrode provided through said insulating film, wherein:

the gate electrode of said MOS transistor is provided through the insulating film on said MOS transistor semiconductor region, and is formed of a semiconductor of a type which is opposite to a conductivity type of said channel region of said MOS transistor, and said lateral type bipolar transistor semiconductor region has an insulating film thereon similar to said MOS transistor, and further has a base electrode of a conductivity type which is the same as that of the semiconductor of the base region and which is of a conductivity type opposite that of the channel region of the MOS transistor, the base electrode being electrically connected to the base region of the lateral type bipolar transistor semiconductor region through an aperture formed at the lateral type bipolar transistor insulating film, and the base electrode functioning as the gate electrode of the MOS transistor.

2. A device according to claim 1, wherein in said lateral type bipolar transistor, the following relation $$(C_1 \times V_{INH})/(C_{BE}+C_1) \geq V_{BEO}$$

is satisfied among a capacitance $C_{BE}$ between a base and an emitter, a capacitance $C_1$ between the base electrode and the base region of said lateral type transistor, an input signal voltage $V_{INH}$ applied between ground and the base electrode, and a base-emitter voltage $V_{BEO}$ when a high level of the input signal voltage $V_{INH}$ is applied to the base electrode.

3. A device according to claim 1, further comprising an element isolation between said lateral bipolar transistor and said MOS transistor.

4. A device according to claim 1, further comprising a second collector region, provided between the base and collector regions, of a same conductivity type as that of the collector region and of an impurity concentration lower than that of the collector region.

5. A device according to claim 1, further comprising a second collector region, provided between the base and collector regions, of a same conductivity type as that of the collector region and of an impurity concentration lower than that of the collector region, wherein said base electrode extends through the lateral type transistor insulating film onto the second collector region.

6. A device according to claim 1, wherein said base electrode is electrically connected to said base region at plural locations.

7. A device according to claim 6, wherein the electrical connections connecting said base electrode and said base region are arranged at an interval not longer than a length twice as long as a minority carrier diffusion length.

8. A device according to claim 1, wherein said semiconductor device comprises a plurality of said lateral type bipolar transistors arranged adjacent to each other, wherein base regions of the plurality of lateral type bipolar transistors are formed commonly to respective lateral type bipolar transistors.

* * * * *

UNITED STATES PATENT AND TRADEMARK OFFICE
CERTIFICATE OF CORRECTION

PATENT NO. : 5,789,790
DATED : August 4, 1998
INVENTOR(S) : MASAKAZU MORISHITA ET AL.

Page 1 of 2

It is certified that error appears in the above-identified patent and that said Letters Patent is hereby corrected as shown below:

ON COVER PAGE AT [56], REFERENCES CITED

Other Publications
"Japn" should read --Japan--.

COLUMN 2

Line 13, "large," should read --large, and--.

COLUMN 5

Line 43, "come" should read --comes--;
    Line 58, "come" should read --comes--.

COLUMN 6

Line 10, "collector" should read --collector are--.

COLUMN 9

Line 63, "the." should read --the--.

COLUMN 10

Line 14, "10" should be deleted;
    Line 20, "p-" should read --p+--.

COLUMN 12

Line 45, "implated" should read --implanted--.

UNITED STATES PATENT AND TRADEMARK OFFICE
CERTIFICATE OF CORRECTION

PATENT NO. : 5,789,790
DATED : August 4, 1998
INVENTOR(S) : MASAKAZU MORISHITA ET AL.

It is certified that error appears in the above-identified patent and that said Letters Patent is hereby corrected as shown below:

COLUMN 13

Line 50, "shows" should read --show--.

COLUMN 15

Line 55, "cm" should read --$cm^{-3}$--.

COLUMN 17

Line 47, "a" (first occurrence) should be deleted.

COLUMN 19

Line 67, "32a" should read --32A--.

Signed and Sealed this

Twenty-fifth Day of May, 1999

Attest:

Q. TODD DICKINSON

*Attesting Officer*    *Acting Commissioner of Patents and Trademarks*